United States Patent

Ishii et al.

[11] Patent Number: 5,938,883
[45] Date of Patent: Aug. 17, 1999

[54] PLASMA PROCESSING APPARATUS

[75] Inventors: Nobuo Ishii; Jiro Hata, both of Yamanashi-ken, Japan

[73] Assignee: Tokyo Electron Limited, Tokyo, Japan

[21] Appl. No.: 08/788,636

[22] Filed: Jan. 27, 1997

Related U.S. Application Data

[63] Continuation of application No. 08/180,281, Jan. 12, 1994, abandoned.

[30] Foreign Application Priority Data

| Jan. 12, 1993 | [JP] | Japan | 5-019193 |
| Jan. 12, 1993 | [JP] | Japan | 5-019217 |
| Mar. 27, 1993 | [JP] | Japan | 5-092511 |

[51] Int. Cl.$^6$ ............................................. H05H 1/00
[52] U.S. Cl. ...................................... 156/345; 118/723 I
[58] Field of Search ........................ 156/345; 118/723 I, 118/723 IR; 216/68; 204/298.33, 298.31, 298.02, 298.07

[56] References Cited

U.S. PATENT DOCUMENTS

| 3,886,896 | 6/1975 | Van Cakenberghe | 118/49.1 |
| 4,434,742 | 3/1984 | Henaff | 118/723 |
| 4,948,458 | 8/1990 | Ogle | |
| 5,091,049 | 2/1992 | Campbell | 156/643 |
| 5,180,435 | 1/1993 | Markunas | 118/723 |
| 5,277,751 | 1/1994 | Ogle | 156/643 |
| 5,304,279 | 4/1994 | Coultas | 156/345 |
| 5,401,350 | 3/1995 | Patrick et al. | 156/345 |
| 5,433,812 | 7/1995 | Cuomo et al. | 156/345 |

FOREIGN PATENT DOCUMENTS

| 0 379 828 | 8/1990 | European Pat. Off. . |
| 4-290428 | 10/1992 | Japan . |

*Primary Examiner*—Thi Dang
*Attorney, Agent, or Firm*—Oblon, Spivak, McClelland, Maier & Neustadt, P.C.

[57] ABSTRACT

Disclosed is a plasma processing apparatus, comprising a processing chamber in which an object to be processed is arranged, a processing gas introducing pipe for introducing a processing gas into the processing chamber, an antenna arranged in that region on the outer surface of the processing chamber which is positioned to correspond to the object to be processed, an insulator being interposed between the antenna and the processing chamber, and a high frequency power being supplied to the antenna so as to form an induction electric field near the object to be processed, and a paramagnetic member arranged to overlap at least partially with the antenna.

13 Claims, 14 Drawing Sheets

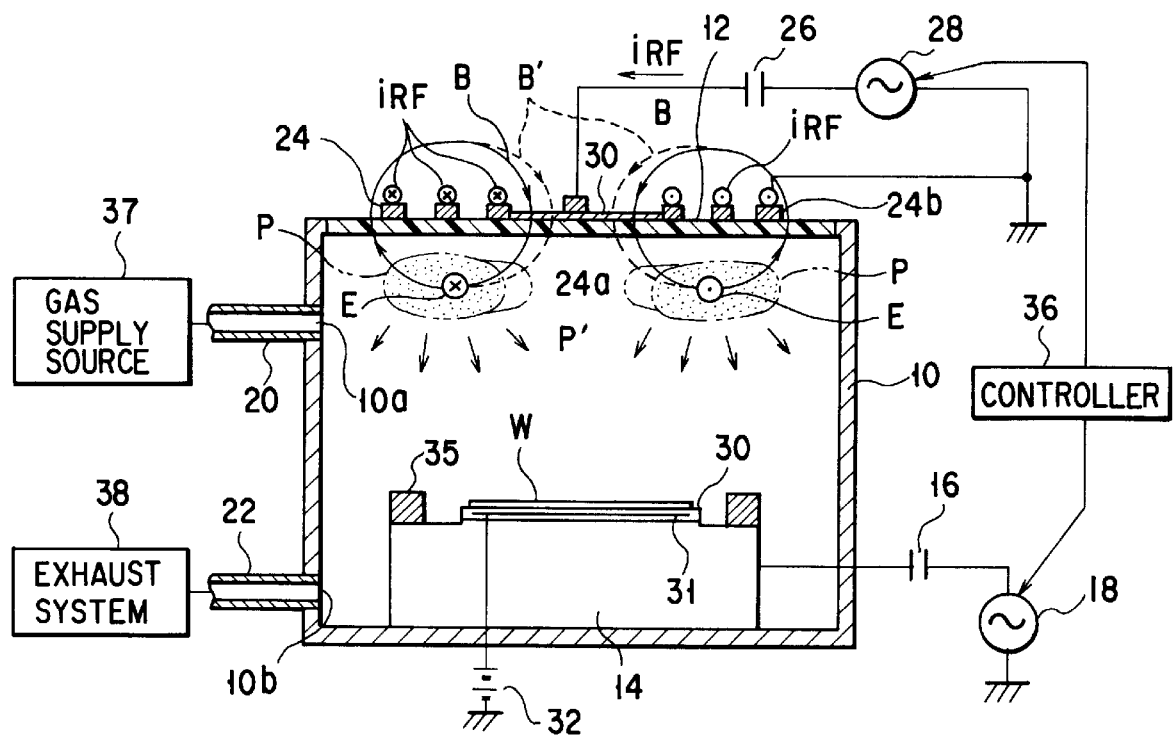
F I G. 2
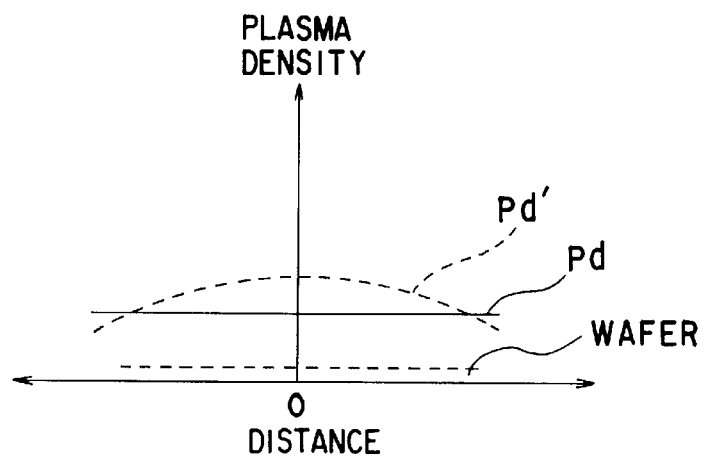
F I G. 3

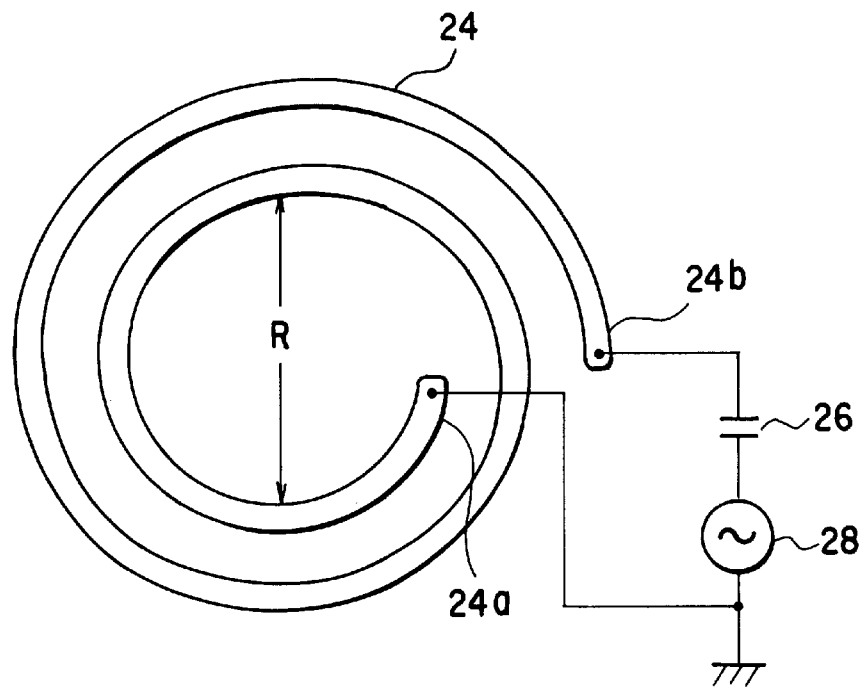
F I G. 6
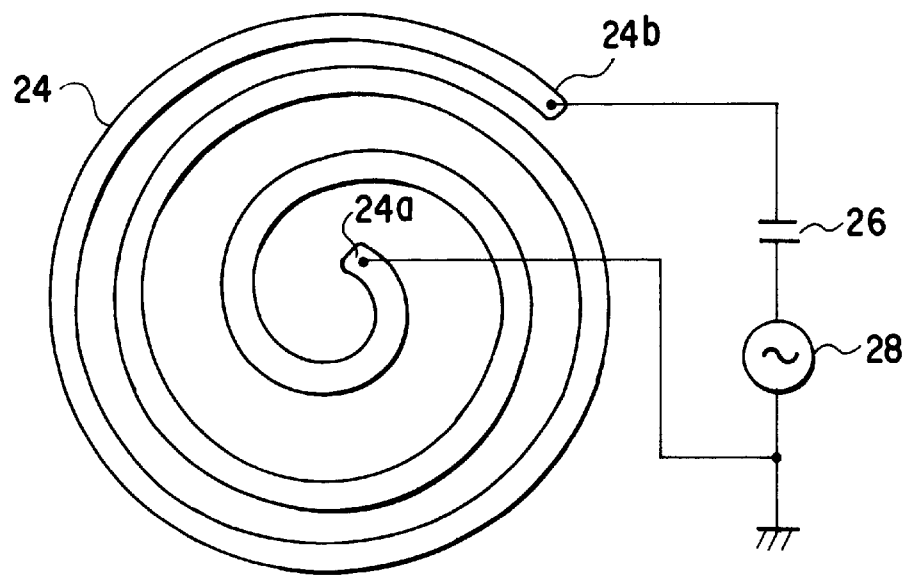
F I G. 7

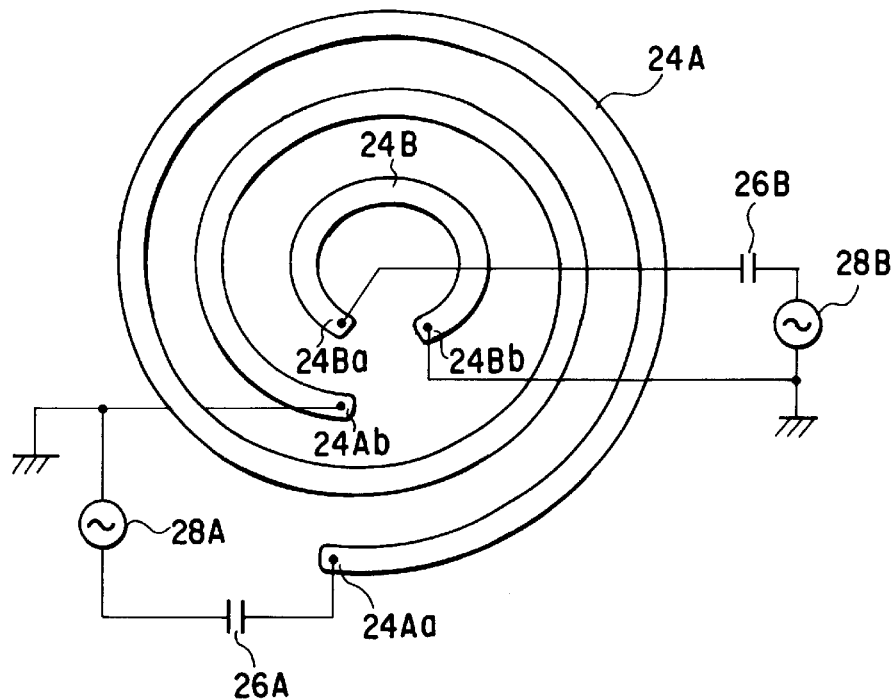
F I G. 10
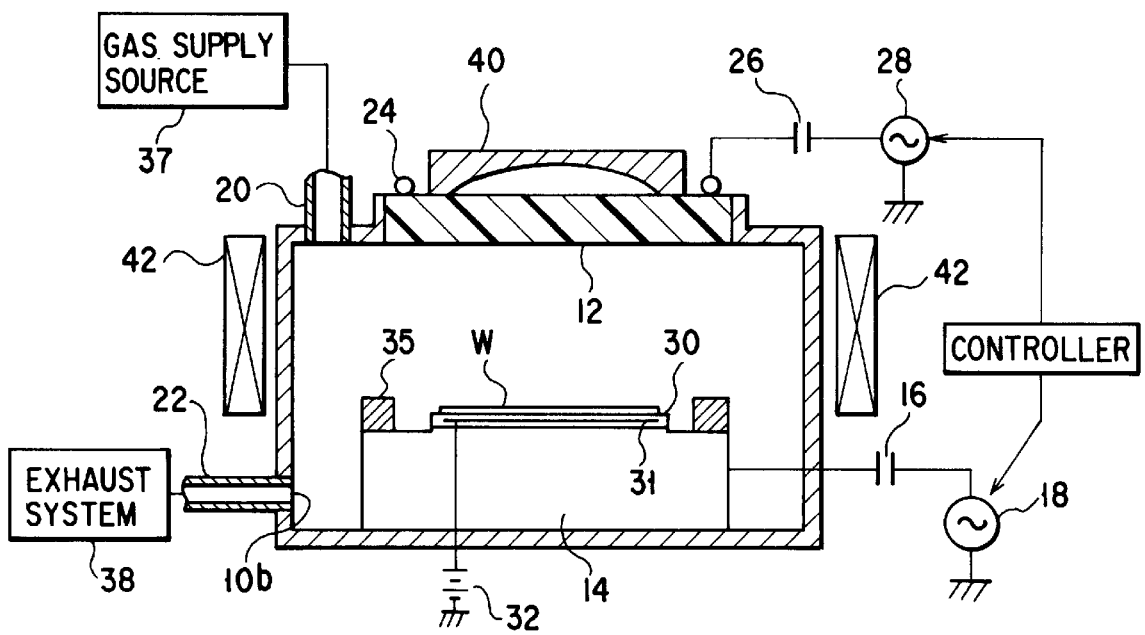
F I G. 11

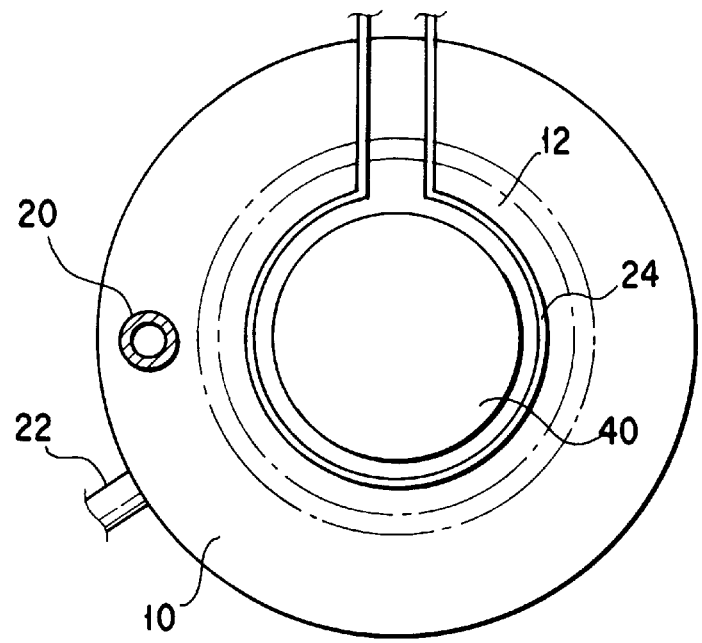
F I G. 12
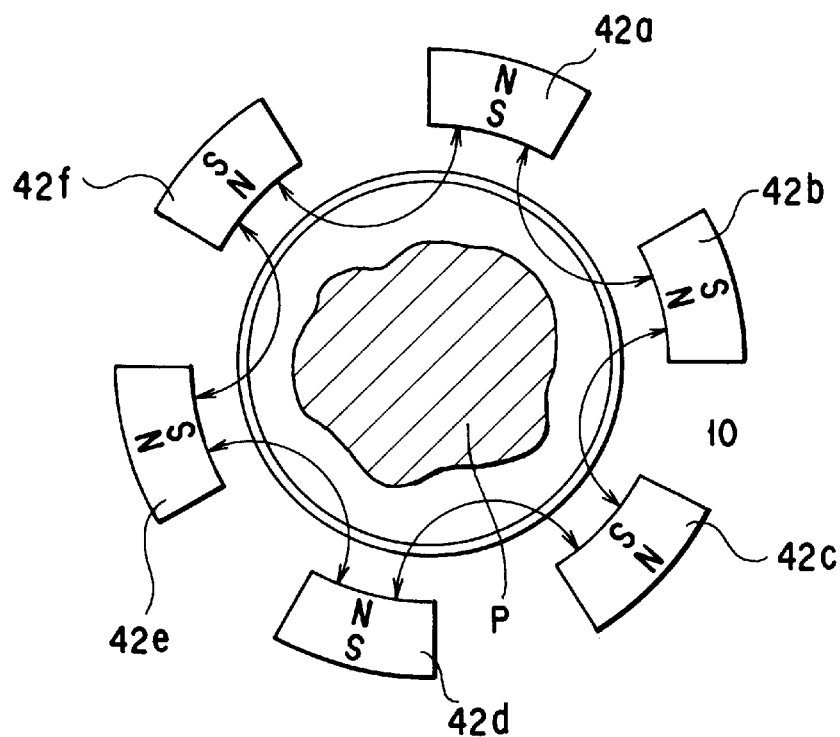
F I G. 13

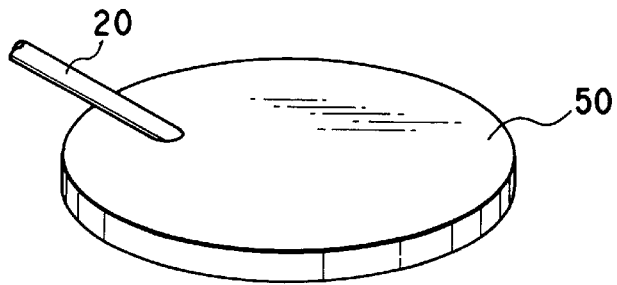
F I G. 19A
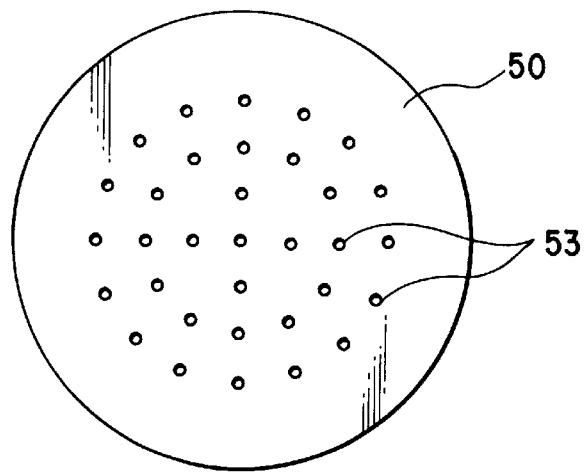
F I G. 19B
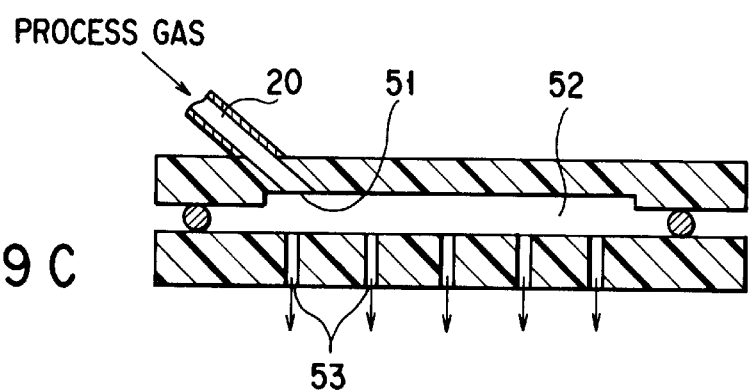
F I G. 19C
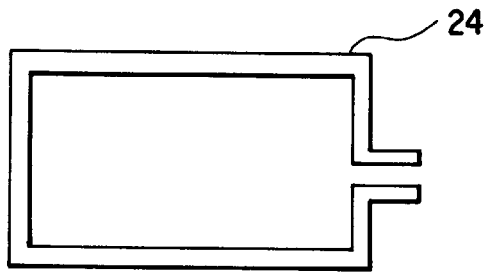
F I G. 20
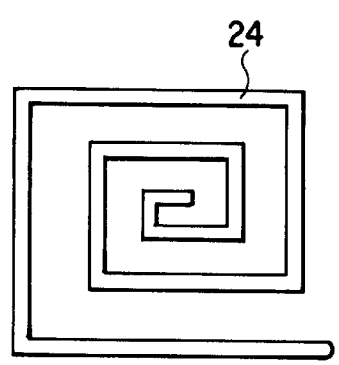
F I G. 21

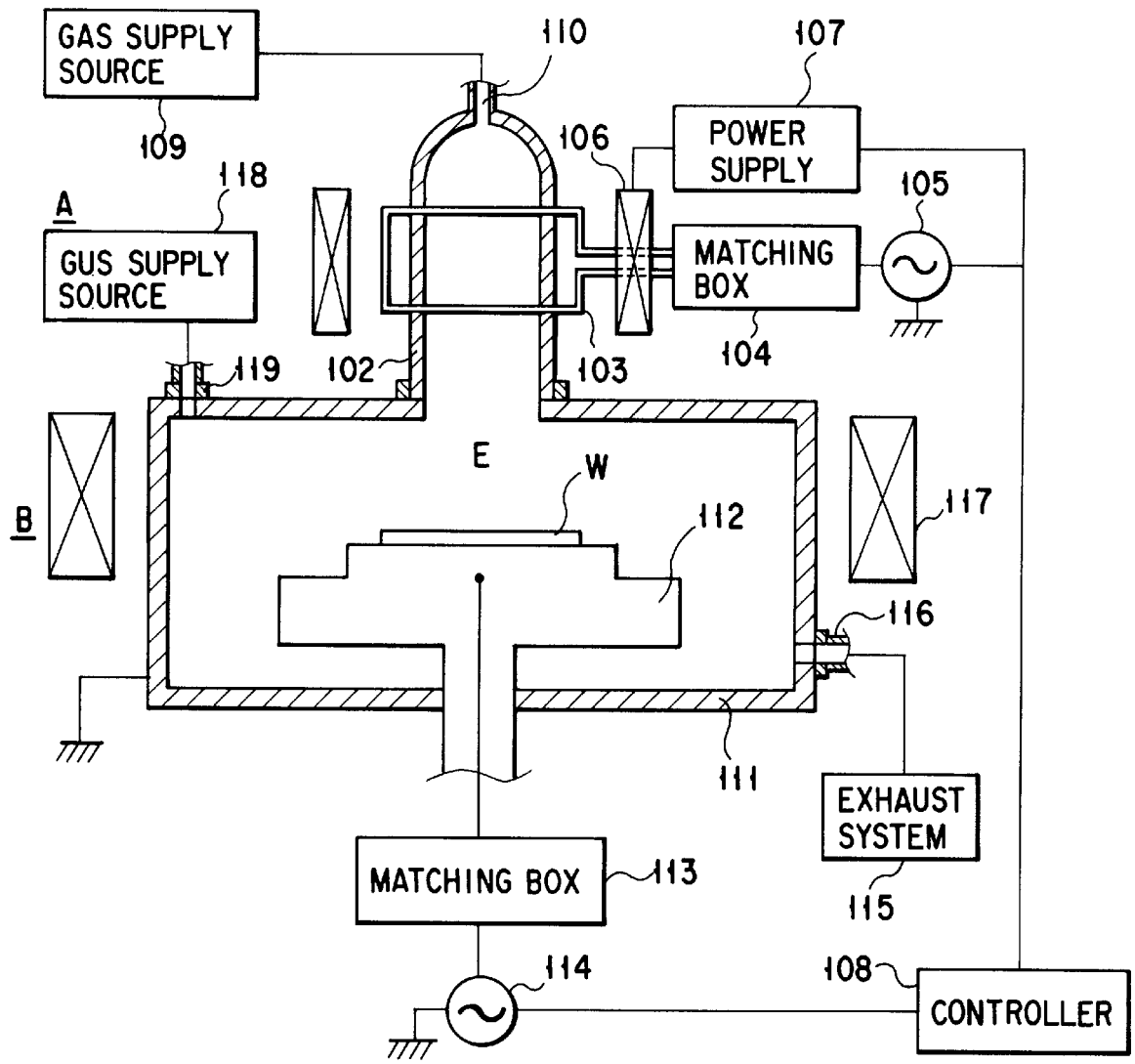
F I G. 22

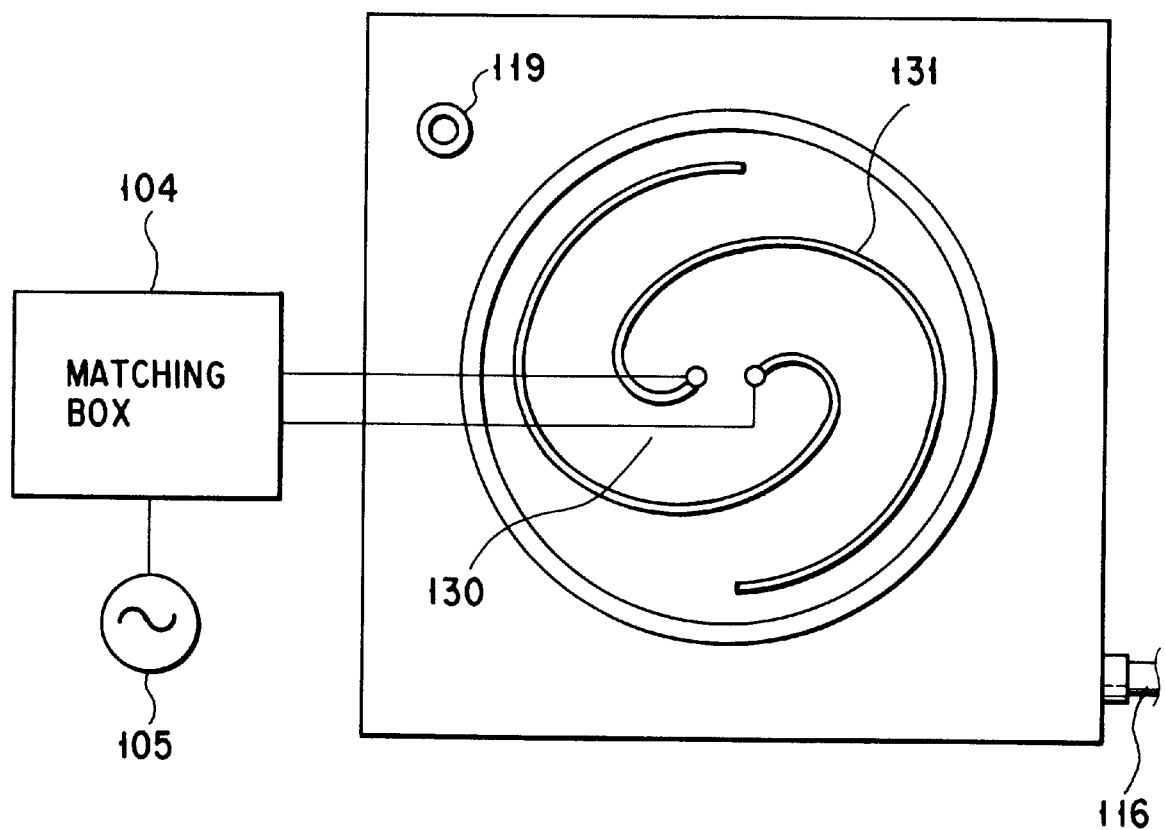
F I G. 28

PLASMA PROCESSING APPARATUS

This application is a Continuation of application Ser. No. 08/180,281 filed on Jan. 12, 1994, now abandoned.

BACKGROUND OF THE INVENTION

1. Field of the Invention

The present invention relates to a plasma processing apparatus for performing a predetermined process using a plasma.

2. Description of the Related Art

In the manufacture of, for example, a semiconductor integrated circuit, plasma is utilized in the steps of ashing, etching, CVD and sputtering treatments in order to promote the ionization of a processing gas, the chemical reaction, etc. It was customary in the past to use in many cases a parallel plate type plasma apparatus using a high frequency (RF) energy as a means for generating a plasma. Recently, proposed is a high frequency induction type plasma processing apparatus using a spiral antenna because the plasma processing apparatus of this type permits a desirable energy density distribution of the plasma, makes it possible to control highly accurately the bias potential between the plasma and the susceptor, and is effective for diminishing the contamination with the heavy metal coming from the electrode. As described in, for example, European Patent Laid-Open Specification No. 379828, the high frequency induction type plasma processing apparatus comprises a processing chamber and a wafer-supporting plate positioned within the processing chamber. In general, the upper wall portion, which is positioned to face the wafer-supporting plate, of the processing chamber is formed of an insulating material such as a silica glass. Also, a spiral antenna is fixed to the outer wall surface of the insulating region of the processing chamber. A high frequency current is allowed to flow through the antenna so as to generate a high frequency electromagnetic field. The electrons flowing within the region of the electromagnetic field are allowed to collide against neutral particles within the processing gas so as to ionize the gas and, thus, to generate a plasma.

In the high frequency induction type plasma processing apparatus, a plasma is formed within the inner space of the processing chamber right under the spiral antenna. Concerning the density distribution of the plasma thus formed relative to the intensity of the electric field, the highest plasma density is formed about midway between the center and the outermost region in the radial direction of the spiral antenna, and the plasma density is gradually lowered toward the center and toward the outermost region of the spiral antenna. In other words, the plasma density is uneven in the radial direction of the spiral antenna. The plasma of the uneven distribution in the radial direction is diffused from the higher density region toward the lower density region, with the result that the plasma density is made considerably uniform near a semiconductor region positioned below the plasma-forming region.

In the conventional plasma processing apparatus of this type, however, the plasma diffusion in the radial direction tends to cause the plasma density in the central region of the semiconductor wafer to be higher than in the outer peripheral region of the wafer, leaving room for further improvement in the uniformity and reproducibility of the plasma processing.

SUMMARY OF THE INVENTION

The present invention, which has been achieved in view of the situation described above, is intended to provide a high frequency induction type plasma processing apparatus which permits a highly uniform plasma density in the region around an object to be processed and is excellent in its uniformity and reproducibility of the plasma processing.

According to a first aspect of the present invention, there is provided a plasma processing apparatus, comprising:

a processing chamber in which an object to be processed is arranged;

a processing gas introducing means for introducing a processing gas into the processing chamber;

an induction member arranged in that region on the outer surface of the processing chamber which is positioned to correspond to the object to be processed, an insulator being interposed between the induction member and the processing chamber, and a high frequency power being supplied to the induction member so as to form an induction electric field near the object to be processed; and a paramagnetic member arranged to overlap at least partially with the induction member.

According to a second aspect of the present invention, there is provided a plasma processing apparatus, comprising:

a processing chamber in which an object to be processed is arranged;

a processing gas introducing means for introducing a processing gas into the processing chamber; and an induction member arranged in that region on the outer surface of the processing chamber which is positioned to correspond to the object to be processed, an insulator being interposed between the induction member and the processing chamber, a high frequency power being supplied to the induction member so as to form an induction electric field near the object to be processed, and the induction member being spiral such that a space is provided in its central region.

According to a third aspect of the present invention, there is provided a plasma processing apparatus, comprising:

a processing chamber in which an object to be processed is arranged;

a processing gas introducing means for introducing a processing gas into the processing chamber; and an induction member arranged in that region on the outer surface of the processing chamber which is positioned to correspond to the object to be processed, an insulator being interposed between the induction member and the processing chamber, a high frequency power being supplied to the induction member so as to form an induction electric field near the object to be processed, and the induction member being spiral and having an outer region and a central region differing from each other in its pitch.

According to a fourth aspect of the present invention, there is provided a plasma processing apparatus, comprising:

a processing chamber in which an object to be processed is arranged;

a processing gas introducing means for introducing a processing gas into the processing chamber; and at least two induction members each arranged in that region on the outer surface of the processing chamber which is positioned to correspond to the object to be processed, an insulator being interposed between the induction members and the processing chamber, a high frequency power being supplied to the induction member so as to form an induction electric field near the object to be processed, each of the two induction members forming a single loop, and the two induction members being arranged in a concentric configuration.

According to a fifth aspect of the present invention, there is provided a plasma processing apparatus, comprising:

a processing chamber in which an object to be processed is arranged;

a processing gas introducing means for introducing a processing gas into the processing chamber; and two induction members each arranged in that region on the outer surface of the processing chamber which is positioned to correspond to the object to be processed, an insulator being interposed between the induction members and the processing chamber, a high frequency power being supplied to the induction member so as to form an induction electric field near the object to be processed, and one of the two induction members forming a single loop with the other being spiral, these two induction members being arranged in a concentric configuration.

According to a sixth aspect of the present invention, there is provided a plasma processing apparatus, comprising:

a processing chamber in which an object to be processed is arranged;

a processing gas introducing means for introducing a processing gas into the processing chamber; and two induction members each arranged in that region on the outer surface of the processing chamber which is positioned to correspond to the object to be processed, an insulator being interposed between the induction members and the processing chamber, a high frequency power being supplied to the induction member so as to form an induction electric field near the object to be processed, and each of the two induction members being spiral, these two induction members being arranged in a concentric configuration.

Further, according to a seventh aspect of the present invention, there is provided a plasma processing apparatus, comprising:

a processing chamber in which an object to be processed is arranged;

a processing gas introducing means for introducing a processing gas into the processing chamber;

an induction member arranged in that region on the outer surface of the processing chamber which is positioned to correspond to the object to be processed, an insulator being interposed between the induction member and the processing chamber, and a high frequency power being supplied to the induction member so as to form an induction electric field near the object to be processed; and a magnetic member arranged in the vicinity of the induction member outside the processing chamber.

BRIEF DESCRIPTION OF THE DRAWINGS

FIG. 2 is a cross sectional view showing the plasma processing apparatus shown in FIG. 1;

FIG. 3 shows the distribution of a plasma density on the surface of a semiconductor wafer used as an object to be processed;

FIG. 6 schematically shows a spiral antenna having the central portion cut away, said antenna exemplifying an induction member used in the apparatus according to a second embodiment of the present invention;

FIG. 7 schematically shows a spiral antenna with the pitch of turns of the antenna conductor changed in its radial direction, said antenna exemplifying an induction member used in the apparatus according to the second embodiment of the present invention;

FIG. 10 schematically shows an antenna consisting of a single loop antenna member and a spiral antenna member arranged to be concentric with the single loop antenna member, said antenna exemplifying an induction member used in the apparatus according to the third embodiment of the present invention;

FIG. 11 is a cross sectional view showing a plasma processing apparatus according to a fourth embodiment of the present invention;

FIG. 12 is a plan view showing the plasma processing apparatus shown in FIG. 11;

FIG. 13 schematically exemplifies a magnetic field forming means used in the apparatus shown in FIG. 11;

FIGS. 19A, 19B and 19C are an oblique view, a back view and a cross sectional view, respectively, of a shower head for introducing a processing gas into the processing chamber included in the apparatus of the present invention;

FIGS. 20 and 21 schematically show modifications of the induction member used in the apparatus of the present invention;

FIG. 22 is a cross sectional view showing another plasma processing apparatus using an induction member;

FIG. 28 schematically shows an antenna used in the apparatus shown in FIG. 27.

DETAILED DESCRIPTION OF THE PREFERRED EMBODIMENTS

Figure 1:
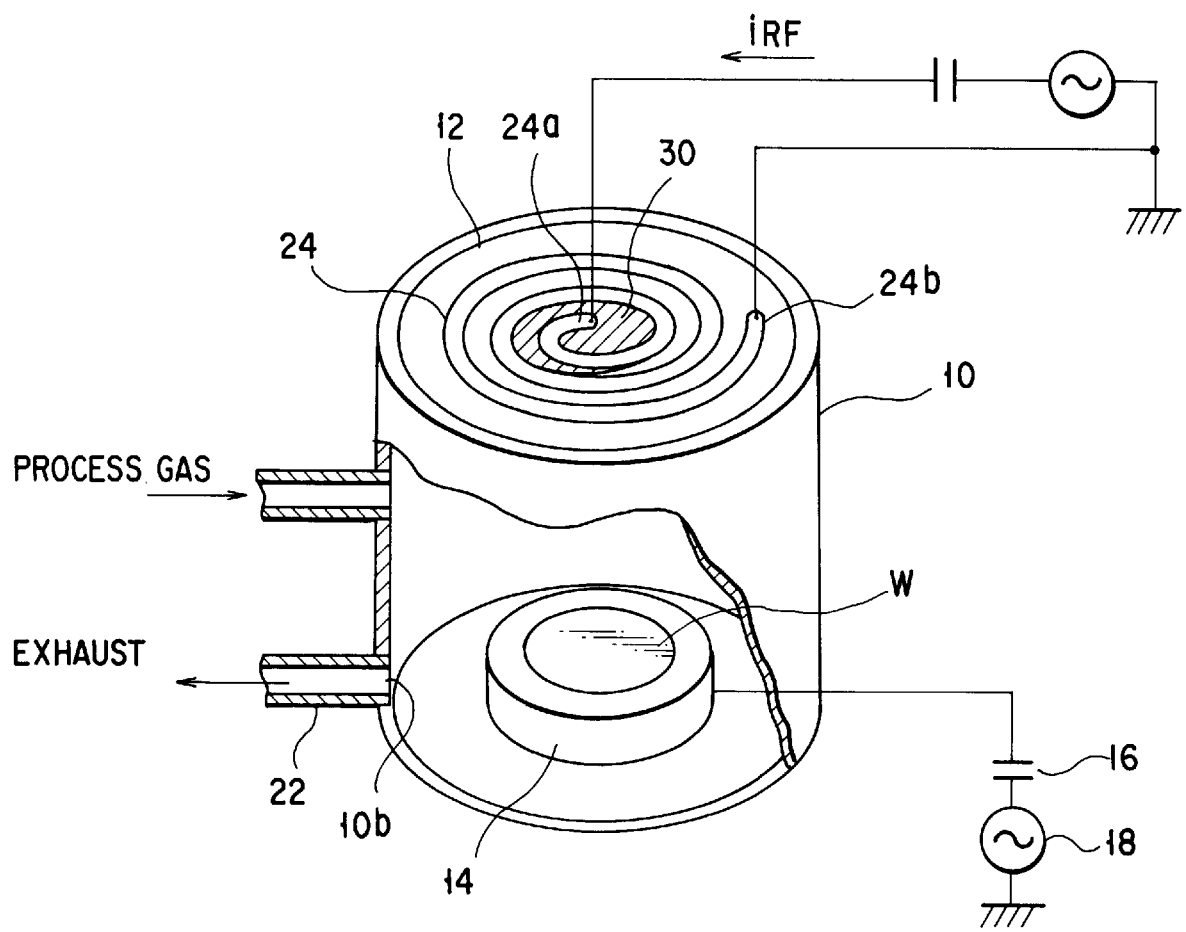
FIG. 1 is an oblique view showing a plasma processing apparatus according to a first embodiment of the present invention.

Let us describe some preferred embodiments of the present invention with reference to the accompanying drawings. First of all, FIG. 1 is an oblique view schematically showing a plasma processing apparatus according to a first embodiment of the present invention. FIG. 2 is a cross sectional view showing the apparatus shown in FIG. 1.

As shown in FIG. 1, the plasma processing apparatus of the present invention comprises a processing chamber 10 which is cylindrical and is hermetically sealed. Each of the bottom wall and side wall of the processing chamber 10 is formed of a metal, e.g., aluminum. On the other hand, an upper wall 12 of the processing chamber 10 is formed of an insulator such as silica glass or a ceramic material. Where the upper wall 12 is formed of a transparent silica glass, it is possible to visually observe the light-emitting state of a plasma within the processing chamber 10.

A disc-like or columnar supporting table (i.e., susceptor) 14 is arranged in the central portion of the bottom wall of the processing chamber 10. A semiconductor wafer W, i.e., an object to be processed, is disposed on the upper surface of the susceptor 14, which is made of, for example, aluminum and having the surface subjected to an anodic oxidation treatment.

Where the plasma processing apparatus shown in the drawing is used as an etching apparatus, a high frequency power source 18 of, for example, 13.56 MHz for the etching treatment is connected to the susceptor 14 via a capacitor 16 acting as a matching circuit. A cooling water for preventing an excess heating by the high frequency power is supplied from a cooling water supply source (not shown) into an inner region of the susceptor 14. A high frequency bias power is applied appropriately from the high frequency power supply 18 to the susceptor 14 depending on the kind and pressure of the processing gas used so as to accelerate the ion stream within a plasma and make the ion stream uniform.

As shown in FIG. 2, a focusing ring 35 made of quartz is arranged on the upper surface of the susceptor 14 within the processing chamber 10 in a manner to surround the semiconductor wafer W acting as an object to be processed. The upper surface of the focusing ring 35 is positioned higher than the upper surface of the wafer W. The focusing ring 35 serves to collect the plasma formed above the susceptor 14 onto the upper surface of the semiconductor wafer W so as to promote the plasma processing efficiency. In the case of, for example, an etching treatment, the focusing ring 35 permits promoting the etching rate. The focusing ring 35 also serves to prevent the exposed portion, which is not covered with the wafer, of the susceptor 14 made of aluminum from being etched to generate dust.

An electrostatic chuck 30 is provided in the wafer-holding surface of the susceptor 14. The electrostatic chuck 30 comprises a copper foil 31 acting as an electrode and an insulating film, e.g., a polyimide film, covering the copper foil 31. It follows that the wafer W is electrostatically attracted accurately to and firmly held by the electrostatic chuck 30. A DC power supply 32 is connected to the electrostatic chuck 30. A DC voltage of, for example, 2 kV is applied from the DC power source 32 to the electrostatic chuck 30, with the result that the wafer w is held by the electrostatic chuck 30 without fail.

A gas inlet port 10a is formed in an upper part of the side wall of the processing chamber 10, and a gas supply pipe 20 is connected to the gas inlet port 10a. A processing gas is supplied from a gas supply source 37 into the processing chamber 10 through the gas supply pipe 20. In this case, the processing gas to be supplied differs depending on the kind of the treatment applied to the object. In the case of, for example, an etching treatment, an etching gas such as a CHF$_3$ gas or a CF$_4$ gas is supplied into the processing chamber 10. In the embodiment shown in the drawing, the apparatus comprises a single gas supply source 37 and a single gas supply pipe 20. Needless to say, however, a plurality of gas supply sources and a plurality of gas supply pipes are connected to the processing chamber 10 in the case where a plurality of different kinds of gases are used for the treatment.

A gas exhaust port 10b is formed in a lower part of the side wall of the processing chamber 10. A gas discharge pipe 22 is connected to the gas discharge port 10b. A gas discharge system including a vacuum pump, etc. is connected to the gas discharge pipe 22 so as to maintain a predetermined degree of vacuum within the processing chamber 10.

A spiral high frequency antenna 24 acting as an induction member is mounted to the outer surface of the upper wall 12 of the processing chamber 12. The antenna 24, which is made of a conductive wire material or a conductive tubular material, is positioned to face the semiconductor wafer W mounted on the susceptor 14 arranged within the chamber 10. It is desirable for the antenna 24 to be made of copper which exhibits an excellent cooling property. A high frequency voltage of, for example, 13.56 MHz is applied from a high frequency power supply 28 for forming a plasma to the antenna 24 through a capacitor 26 acting as a matching circuit. To be more specific, the high frequency voltage noted above is applied between an inner terminal 24a and an outer terminal 24b of the antenna 24. As a result, a high frequency current $i_{RF}$ flows through the antenna 24 so as to form an induced electric field in the free space right under the antenna 24 within the processing chamber 10 and, thus, to form a plasma of the processing gas, as described herein later. It should be noted that the high frequency power supplies 18 and 28 are controlled by a controller 36.

In the embodiment shown in FIGS. 1 and 2, a circular thin plate 30 made of a paramagnetic metal such as copper is interposed between the central portion of the high frequency antenna 24 and the silica glass 12, and an electrical insulator (not shown) is interposed the antenna 24 and the plate 30. The diameter of the circular thin plate 30 is determined appropriately in view of the shape and size of the antenna 24, the output power of the high frequency power supply 28, the diameter of the semiconductor wafer W, the distance between the antenna 24 and the semiconductor wafer W, etc. As described herein later, an alternating magnetic field B is controlled in the free space within the processing chamber 10 by the circular thin plate 30. As a result, an alternating electric field E induced in the free space noted above is controlled so as to permit diffusion of a plasma. It follows that the plasma density is rendered uniform in the surface region of the semiconductor wafer W.

Let us describe with reference to FIG. 2 how a plasma is formed and how a plasma processing is applied in the plasma processing apparatus of the construction described above.

In the first step, a semiconductor wafer W acting as an object to be processed is transferred from a load lock chamber (not shown) adjacent to the processing chamber 10 into the chamber 10 which is evacuated in advance to a vacuum of, for example, $10_{-6}$ Torr. The semiconductor wafer W thus introduced into the chamber 10 is held by the electrostatic chuck 30.

In the next step, a predetermined processing gas such as a CHF$_3$ gas or a CF$_4$ gas is introduced into the processing chamber 10 through the gas supply pipe 20. In this step, the pressure within the chamber 30 is controlled to be, for example, $10_{-3}$ Torr. Under this condition, a high frequency voltage is applied from the high frequency power supply 28 to the spiral antenna 24, with the result that a high frequency current $i_{RF}$ is caused to flow through the spiral antenna 24. Flow of the high frequency current $i_{RF}$ permits generation of an alternating magnetic field B around the antenna conductor. A majority of the magnetic fluxes thus formed run in a vertical direction through the central portion of the antenna so as to form a closed loop. The alternating magnetic field B induces an alternating electric field E right under the antenna 24. The induced alternating electric field E is substantially concentric and runs in a circumferential direction. What should be noted is that electrons are accelerated in the circumferential direction by the alternating electric field E and collide against the neutral particles within the processing gas so as to ionize the gaseous molecules and, thus, to form a plasma.

The plasma thus formed right under the antenna 24 has the highest density substantially midway between the center and the outermost region in the radial direction of the antenna 24, as schematically shown in FIG. 2. In other words, the plasma density is gradually lowered from the highest density region noted above toward the center and toward the outermost region in the radial direction of the spiral antenna 24.

In the embodiment shown in the drawing, an eddy current flows within the copper plate 30 in a manner to obstruct the passage of the magnetic fluxes B therethrough, with the result that the magnetic fluxes B are unlikely to run through the central portion of the antenna 24. It follows that the magnetic fluxes B run outside magnetic fluxes B' denoted by dotted lines, i.e., the magnetic fluxes B' in the absence of the copper plate 30. This causes a plasma forming region P right under the antenna 24 to be displaced to the outside in the radial direction of a plasma forming region P' denoted by a dotted line, i.e., the plasma forming region P' in the absence of the copper plate 30.

As described previously, the plasma is diffused from a higher density region toward a lower density region in the absence of the copper plate 30 so as to make the plasma density uniform in the vicinity of the semiconductor wafer W. As a result, the plasma density in the central region of the wafer W is rendered higher than in the outer peripheral region of the wafer, as denoted by "Pd'" in FIG. 3. It follows that a uniform treatment can be performed on the wafer surface.

On the other hand, where the copper plate 30 is disposed as shown in FIG. 2, formed is the plasma forming region P which is displaced to the outside in the radial direction of the plasma forming region P' denoted by a dotted line, which is formed in the absence of the copper plate 30. As a result, the plasma is diffused both in the radial direction and in the vertical direction so as to make the plasma density uniform in the vicinity of the semiconductor wafer W. It follows that the plasma density is rendered substantially uniform in the vicinity of the surface of the semiconductor wafer W, as denoted by "Pd" in FIG. 3. Since the plasma density is substantially uniform, the active species within the plasma such as the ions and electrons are supplied uniformly to the entire surface region of the semiconductor wafer W, making it possible to apply a predetermined plasma processing uniformly to the entire surface of the wafer.

When it comes to, for example, a plasma etching treatment, the gaseous molecules excited by the plasma into an active state are enabled to perform a chemical reaction with the substance of the workpiece. In this case, the reaction product is vaporized so as to cause the substances on the wafer surface to be taken away. In the case of a CVD treatment, the gaseous molecules excited by the plasma are allowed to react each other. In this case, the reaction product is deposited on the wafer surface so as to form a CVD film.

As exemplified above, a plasma is allowed to act with a uniform density on the entire surface of the semiconductor wafer W in the plasma processing apparatus of the present invention in any of the plasma processings, making it possible to achieve a uniform processing on the wafer surface.

When the plasma processing applied to the wafer W is finished within the processing chamber 10, the residual gas and the residual reaction product are exhausted out of the processing chamber 10 by the exhaust system 38, followed by taking the semiconductor wafer W disposed on the susceptor 14 out of the processing chamber 10 by using a transfer arm and subsequently putting the semiconductor wafer W in the load lock chamber.

As described above, the plasma processing apparatus shown in FIGS. 1 and 2 comprises the metal plate 30 formed of a paramagnetic metal such as copper, which is arranged to overlap at least partially with the spiral antenna 24 acting as an induction member, e.g., overlap with the central portion of the antenna 24. What should be noted is that the copper plate 30 serves to weaken the magnetic fluxes so as to weaken the alternating electric field in that region within the free space of the processing chamber which corresponds to the copper plate 30, leading to a lower density of the plasma formed. Where the copper plate 30 is arranged in the central portion of the antenna 24, the plasma forming region P right under the antenna 24 is displaced outward in the radial direction, with the result that the plasma density is made uniform on the surface of the semiconductor wafer W. It follows that the apparatus of the present invention makes it possible to apply a plasma processing uniformly and with a high reproducibility to the wafer W.

Figure 4:
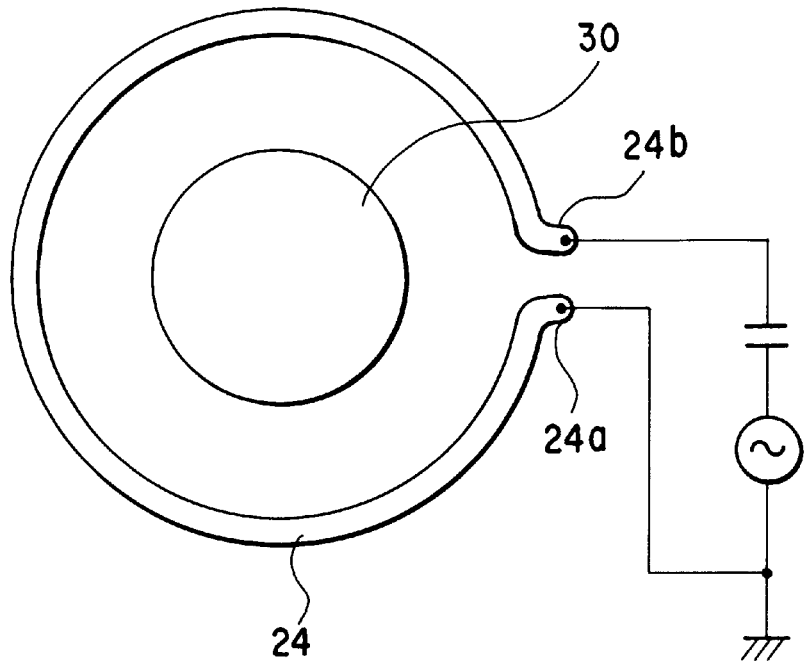
FIG. 4 schematically shows a single loop antenna as an example of an induction member used in the apparatus according to the first embodiment of the present invention.
Figure 5:
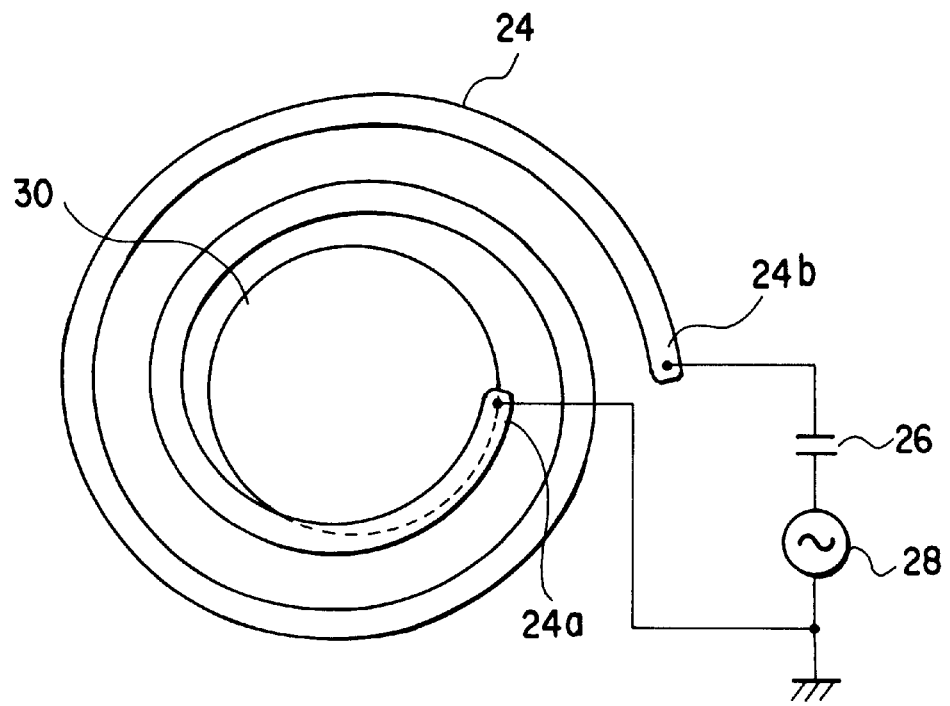
FIG. 5 schematically shows a spiral antenna having the central portion cut away, said antenna exemplifying the induction member used in the apparatus according to the first embodiment of the present invention.

In the embodiment described above, the antenna 24 used as an induction member is spiral. However, it is also possible to use an antenna in the form of a single loop, i.e., a ring-like antenna, as shown in FIG. 4. In the case of using such a ring-like antenna, it is also possible to form an alternating electric field as in the case of using a spiral antenna, making it possible to form a relatively uniform plasma. It is also possible to use a modified spiral antenna as shown in FIG. 5. In this case, the central portion of the spiral configuration is cut away to provide the modified spiral antenna. In the case of using the modified spiral antenna as shown in FIG. 5, the diameter of the space region in the central portion is determined appropriately in view of the number of turns of the spiral antenna 24, the output power of the high frequency power supply 28, the diameter of the semiconductor wafer W, the distance between the antenna 24 and the wafer W, etc.

The shape of the member formed of a paramagnetic metal need not be restricted to a plate. It should also be noted that it suffices for the paramagnetic metal member to be arranged in the vicinity of the antenna acting as an induction member. For example, the paramagnetic metal member may be arranged in the central portion of the antenna as in the embodiment shown in FIGS. 1 and 2 and in other regions. Further, the paramagnetic metal member may be arranged in a plurality of portions, as required, e.g., both in the central portion and outer peripheral region of the antenna. Still further, the paramagnetic metal member may be arranged to overlap completely with the antenna.

Let us describe a second embodiment of the present invention. The basic construction of the plasma processing apparatus according to the second embodiment is substantially equal to that of the first embodiment described above. In the second embodiment, however, a paramagnetic metal is not used for controlling the plasma density. In place of using a paramagnetic metal, the state of the spiral antenna is changed so as to control the plasma density in the plasma processing apparatus of the second embodiment.

FIG. 6 shows that the antenna 24 acting as an induction member is spiral and has a space region in the central portion. In the spiral antenna 24 having a space region in the central portion, the number of magnetic fluxes passing in the vertical direction through the central portion of the antenna is decreased, leading to reduction in the electric field of the alternating electric field induced right under the spiral antenna. It follows that the plasma forming region P is displaced toward the outside in the radial direction of the antenna, as in the first embodiment. The displacement of the plasma forming region P permits making the plasma density uniform as in the first embodiment. In this case, it is necessary to enlarge the diameter R of the space region in the central portion of the antenna, compared with the diameter in the case of FIG. 5, because the paramagnetic metal member included in the first embodiment is not included in the embodiment of FIG. 6. For example, it is necessary to select the diameter R equal to the diameter of the wafer W, e.g., 6 inches. Incidentally, the diameter of the free space region in the central portion of the antenna is determined appropriately in view of the number of turns of the antenna 24, the output power of the high frequency power supply 28, the diameter of the semiconductor wafer W, the distance between the antenna 24 and the wafer w in the case of the antenna shown in FIG. 6, too.

In the spiral antenna 24 shown in FIG. 7, the pitch of turns of the antenna conductor is made uneven in the radial direction of the antenna 24. As shown in the drawing, the pitch is shorter in the outer region and is made gradually longer toward the center of the antenna. According to the particular spiral structure, concentric alternating electric field induced right under the antenna is rendered relatively weaker toward the central portion, with the result that the plasma forming region is shifted toward the outer region in the radial direction of the antenna. It follows that it is possible to obtain an effect similar to that obtained in the first embodiment.

Let us describe a plasma processing apparatus according to a third embodiment of the present invention. In this embodiment, two antennas used as an induction member are concentrically arranged, and the high frequency voltages supplied to these two antennas are independently controlled.

Figure 8:
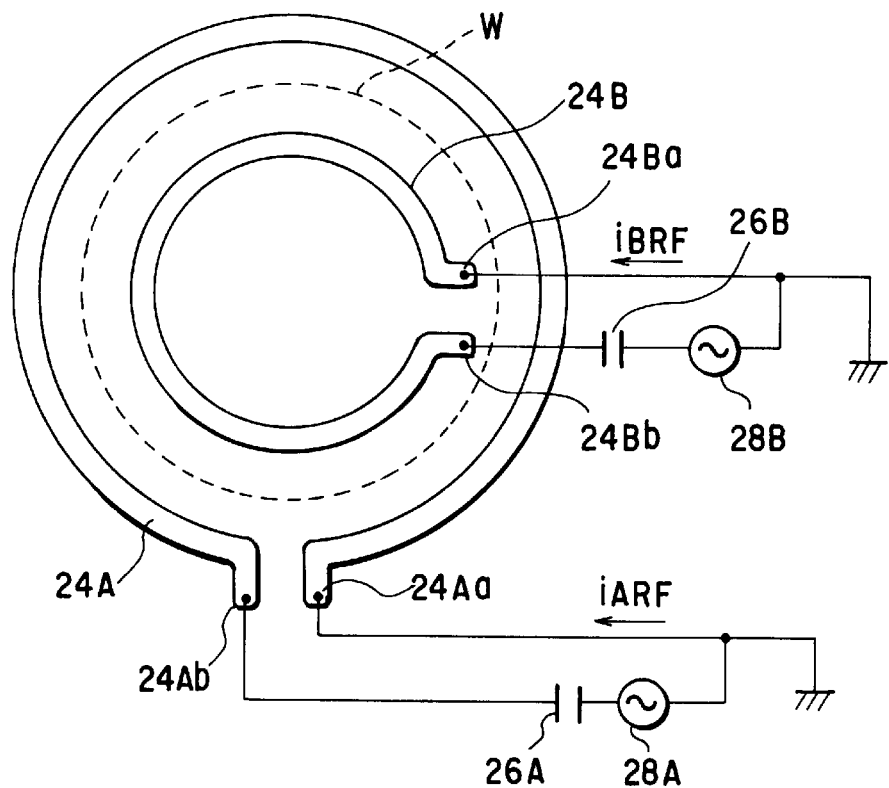
FIG. 8 schematically shows an antenna of a double ring structure, which exemplifies an induction member used in the apparatus according to a third embodiment of the present invention.

To be more specific, FIG. 8 shows that ring-like antennas 24A and 24B are concentrically arranged on, preferably, the same plane. As shown in the drawing, a first high frequency power supply 28A is connected to a terminal 24A$a$ and to a terminal 24A$b$, via a capacitor 26A acting as a matching circuit, of the outer antenna 24A. Likewise, a second high frequency power supply 28B is connected to a terminal 24B$a$ and to another terminal 24B$b$, via a capacitor 26B acting as a matching circuit, of the inner antenna 24B.

These first and second high frequency power supplies 28A and 28B serve to supply independently first and second high frequency powers of the same frequency, e.g., 13.56 MHz, and same phase to the outer and inner ring-like antennas 24A and 24B. Where these antennas are arranged in substantially the same positions as in the embodiment shown in FIGS. 1 and 2, the second high frequency power is selected to be smaller than the first high frequency power. As a result, a relatively large high frequency current $i_{ARF}$ is allowed to flow through the outer ring-like antenna 24A, with a relatively small high frequency power $i_{BRF}$ being allowed to flow through the inner ring-like antenna 24B. In this case, the plasma forming region P in the free space right under the antenna within the processing chamber is shifted toward the outside, compared with the plasma forming region P' shown in FIG. 2 in the case where the same high frequency current $i_{RF}$ flows through the single antenna 24. It follows that the plasma density is rendered uniform as in the embodiment shown in FIGS. 1 and 2. In order to make the plasma density more uniform in this case, it is desirable to arrange these outer ring-like antenna 24A and inner ring-like antenna 24B such that the semiconductor wafer w used as an object to be processed is positioned in a region corresponding to the region between these outer and inner antennas 24A and 24B.

Where the antennas used as an induction member are constructed as described above, it is possible to determine independently the high frequency power supplied to each of these inner and outer antennas, making it possible to control the plasma forming region more accurately over a wider range. Incidentally, it is possible to use commonly a single high frequency power supply in place of the first and second high frequency power supplies 28A and 28B by providing a power distributing circuit between the high frequency power supply and the antenna 24A and between the high frequency power supply and the other antenna 24B.

Figure 9:
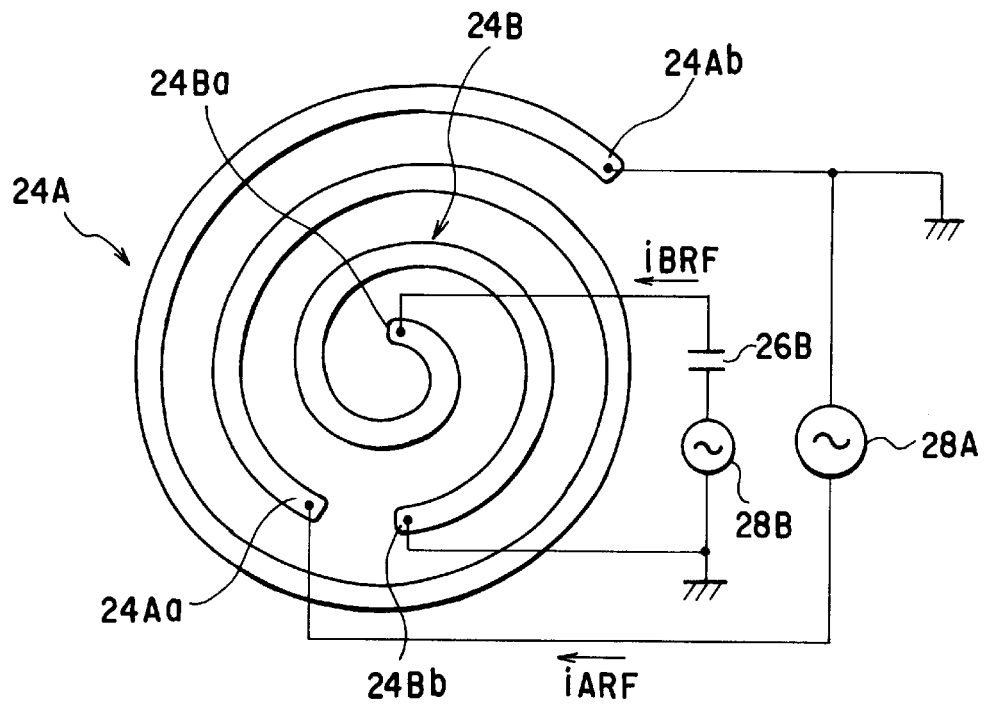
FIG. 9 schematically shows an antenna consisting of two spiral antenna members arranged to collectively form a large spiral structure, said antenna exemplifying an induction member used in the apparatus according to the third embodiment of the present invention.

In the embodiment shown in FIG. 9, two spiral antennas 24A and 24B are concentrically arranged such that these antennas substantially form a larger spiral configuration. To be more specific, an inner spiral antenna 24B is arranged inside an outer spiral antenna 24A, and these inner and outer spiral antennas 24B, 24A are connected to high frequency power supplies 28B, 28A via capacitors 26B, 26A, respectively. The arrangement shown in FIG. 9 produces an effect similar to that obtained from the arrangement shown in FIG. 8. It should be noted that the number of turns of each of these spiral antennas can be determined appropriately in view of the output of each of the high frequency power supplies 28B, 28A, the diameter of the semiconductor wafer, the distance between the antenna and the semiconductor wafer, etc. In the embodiment shown in FIG. 8, two spiral antennas are arranged to form a larger spiral configuration. However, it is also possible to arrange three or more spiral antennas to form a larger spiral configuration.

FIG. 10 shows that a ring-like antenna 24B is concentrically arranged inside a spiral antenna 24A. Of course, the arrangement shown in FIG. 10 also produces a similar effect. Incidentally, a ring-like antenna is arranged inside a spiral antenna in the embodiment shown in FIG. 10. Needless to say, however, it is also possible to arrange a ring-like antenna outside a spiral antenna.

It is also possible to use a paramagnetic metal member as used in the first embodiment described previously in each of the embodiments shown in FIGS. 8 to 10. In this case, both the high frequency power and the paramagnetic metal member can be utilized for controlling the plasma density.

Let us describe a plasma processing apparatus according to a fourth embodiment of the present invention with reference to FIGS. 11 and 12. The basic construction of the apparatus shown in these drawings is substantially equal to that of the apparatus shown in FIGS. 1 and 2. Thus, the same reference numerals are put to the same members of the apparatus, and the description thereof is omitted in the following description of the apparatus shown in FIGS. 11 and 12. In this embodiment, a ring-like antenna 24 acting as an induction member is arranged on the outer surface of the upper wall 12 of the processing chamber 10 formed of an insulator. The antenna 24 is arranged to surround a region corresponding to a semiconductor wafer W acting as an object to be processed. Also, a magnetic member 40 is arranged in substantially the central portion on the outer surface of the upper wall 12 such that the location of the magnetic member 40 corresponds to the position of the wafer W inside the ring-like antenna 24. As a result, a magnetic field is allowed to act in the plasma forming region within the processing chamber 10. The magnetic member 10, which is formed of a ferromagnetic material, should desirably be low in its electrical conductivity. For example, it is desirable to use a soft ferrite, e.g., a Ni—Zn based material, for forming the magnetic member 10. Where the magnetic member 40 is formed of a material having a high electrical conductivity, an eddy current is generated by an alternating magnetic field when a high frequency current is allowed to flow through the magnetic member 40, resulting in failure to form a desired magnetic field within the processing chamber 10.

The magnetic member 10 is formed to have a relatively thicker portion and a relatively thinner portion. To be more specific, that region of the magnetic member 10 which serves to form a magnetic field applied to a region in which it is desirable to relatively increase the plasma density is formed relatively thicker, with that region of the magnetic member 10 which serves to form a magnetic field applied to other regions is formed relatively thinner. The plasma density can be controlled as desired by controlling the thickness of the magnetic member 40 in this fashion. For example, the outer peripheral portion of the magnetic member 40 is formed thicker, with the central portion being formed thinner, as shown in FIG. 11 so as to have the plasma density distributed uniformly within a plane within the processing chamber 10. Needless to say, however, the shape of the magnetic member 40 is not restricted to that exemplified in FIG. 11. In other words, the shape of the magnetic member 40 can be determined appropriately in view of the process conditions.

It is also important to pay attentions to the cross sectional area in the horizontal direction of the magnetic member 40, i.e., the cross sectional area substantially parallel with the processing surface of the wafer W disposed within the processing chamber 10. To be more specific, it is desirable to make the cross sectional area noted above of the magnetic member 40 larger than the processing area of the wafer W. The particular construction makes it possible to allow the magnetic field generated from the magnetic member 40 to act over the entire region of the processing area of the wafer W, with the result that the plasma density distribution can be controlled more accurately.

It should be noted that, where a high frequency current is allowed to flow through the antenna 24 for the plasma generation, a demagnetizing field is likely to be generated within the magnetic member 40 so as to adversely affect the magnetic field generated from the magnetic member 40. It follows that it is desirable to determine the thickness of the magnetic member 40 in a manner to make the influence given by the demagnetizing field negligible. It is also desirable to make, for example, the magnetic path longer so as to dominate the adverse effect given by the diamagnetic field.

In the embodiment shown in FIGS. 11 and 12, a magnetic field forming means 42 formed of, for example, a permanent magnet is arranged to surround the processing chamber 10. As shown in, for example, FIG. 13, the magnetic field forming means 42 consists of a plurality of permanent magnets 42a to 42f arranged to form a ring-like configuration. These permanent magnets 42a to 42f are arranged such that the adjacent permanent magnets are opposite to each other in polarities so as to form a multi-polar magnetic field having lines of magnetic force as denoted by arrows in FIG. 13. The multi-polar magnetic field thus formed serves to push the plasma stream, which is likely to collide against the inner wall of the processing chamber 10, back toward the center of the chamber 10 so as to retain a plasma of a desired shape in the vicinity of the semiconductor wafer W used as an object to be processed.

Let us describe more in detail the function of the magnetic member 40 included in the embodiment shown in FIGS. 11 and 12. In general, distribution of the plasma density within the processing chamber 10 is affected by the magnetic field distribution within the chamber 10. Thus, in this embodiment, the magnetic member 40 formed of, for example, a soft ferrite is mounted on the upper wall 12 formed of an insulator in order to control the magnetic field distribution within the chamber 10. To be more specific, the shape of the magnetic member 40 is changed appropriately so as to control the magnetic field distribution within the processing chamber 10 and, thus, to control the distribution of the plasma density. To achieve the object, that region of the magnetic member 40 which serves to form a magnetic field acting on a region in which it is desirable to increase relatively the plasma density is made relatively thicker, with the other region of the magnetic member 40 being made relatively thinner, as described previously.

It is also necessary to control as desired the distribution of the plasma density over the entire processing surface of the semiconductor wafer W used as an object to be processed. To achieve the object, it is also important to pay attentions to the cross sectional area in the horizontal direction of the magnetic member 40 formed of a soft ferrite, i.e., the cross sectional area substantially parallel with the processing surface of the semiconductor wafer W. To be more specific, it is necessary to make the cross sectional area noted above of the magnetic member 40 larger than the processing surface area of the wafer W. What should also be noted is that a diamagnetic field is generated within the magnetic member 40, if a high frequency current is allowed to flow through the antenna 24, as described previously. To overcome the difficulty, it is desirable to make the thickness of the magnetic member 40 negligibly small in terms of the demagnetizing field generation.

As described above, the distribution of the plasma density within the processing chamber 10 can be controlled as desired by controlling appropriately the shape of the magnetic member 40. Suppose that the magnetic member 40 is not included in the apparatus shown in FIG. 11. In this case, the plasma density in the peripheral portion within the processing chamber 10 is generally rendered lower than in the central portion, as described previously in conjunction with the first embodiment shown in FIGS. 1 and 2. In order to make the plasma density uniform over the entire region, the thickness of the magnetic member 40 should be made larger in the peripheral portion than in the central region as shown in FIG. 11. Alternatively, the magnetic member 40 should be constructed to provide a longer magnetic path.

It should be noted that the required distribution of the plasma density depends on various factors including the kind of the object to be processed, the kind of the reactive gas used, and the gas pressure. In the present invention, however, a desired optimum distribution of the plasma density can be obtained by controlling appropriately the shape of the magnetic member 40 formed of a soft ferrite.

Figure 14:
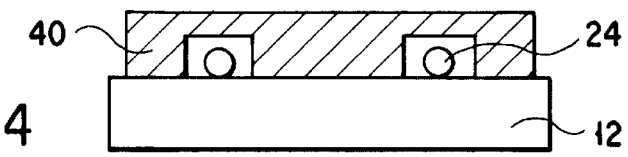
FIGS. 14 to 16 show other examples of the magnetic member used in the apparatus according to the fourth embodiment of the present invention.

In the embodiment shown in, for example, FIG. 14, a looped antenna 24 is completely covered with the magnetic member 40. As a result, it is possible to offset the effect of the demagnetizing field which is generated when a high frequency current is allowed to flow through the antenna 24. It is also possible to supply a magnetic field over the entire processing surface of the semiconductor wafer W.

Figure 15:
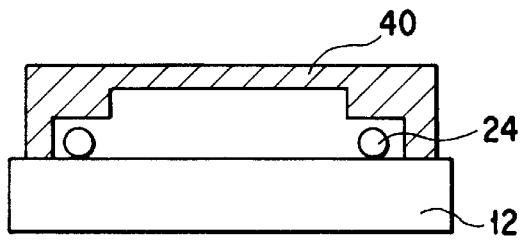

In the embodiment shown in FIG. 15, a region outside the magnetic member 40 is covered with the magnetic member 40. In this case, it is also possible to offset the effect of the demagnetizing field noted above. Further, the central portion of the magnetic member 40 is made thinner than the peripheral portion, with the result that the distribution of the plasma density within the processing chamber 10 can be made uniform.

Figure 16:
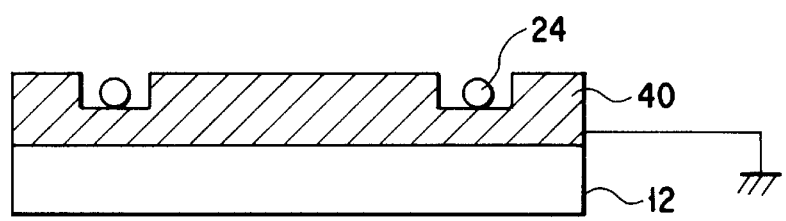

Further, in the embodiment shown in FIG. 16, the magnetic member 40 is interposed between the antenna 24 and the upper wall 12. In this case, an electrostatic shielding effect can be obtained by setting the magnetic member 40 at a predetermined potential, e.g., ground potential.

Figure 17:
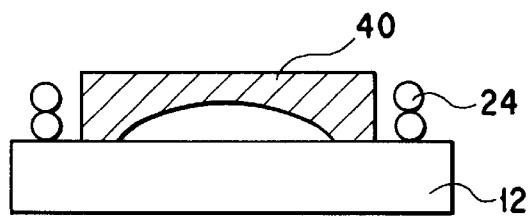
FIGS. 17 and 18 show other examples of the induction member used in the apparatus according to the fourth embodiment of the present invention.

In the embodiment shown in FIGS. 11 and 12, the antenna 24 is in a simple form of a single loop. As a matter of fact, the shape of the antenna 24 is not particularly restricted as far as the antenna is enabled to form a satisfactory alternating magnetic field within the processing chamber 10 when a high frequency current is allowed to flow through the antenna. For example, it is possible to superpose antennas in the shape of a simple loop one upon the other, as shown in FIG. 17 so as to strengthen the alternating magnetic field. It is also possible to use a spiral antenna as in the embodiments described previously so as to form an alternating magnetic field over a wide range.

Figure 18:
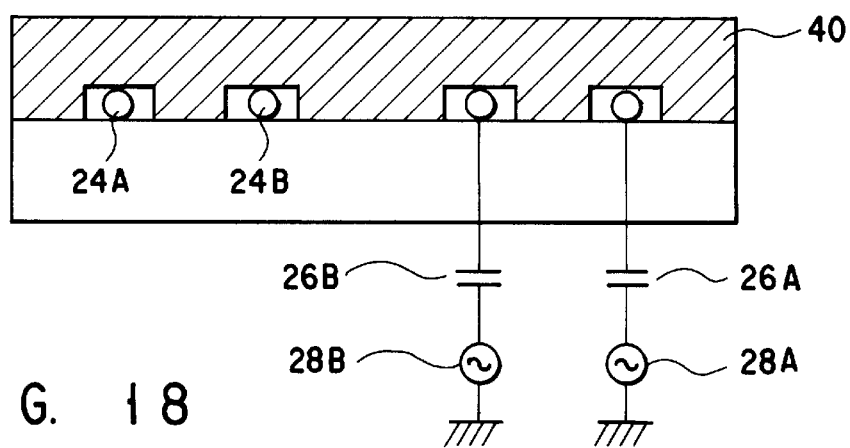

Further, two ring-like antennas 24A and 24B can be concentrically arranged as shown in FIG. 18. In this case, a single high frequency power supply which is shared by two high frequency power supplies can be controlled independently so as to control more effectively the plasma density distribution, as described previously in conjunction with the third embodiment.

In any of the embodiments described above, it is desirable to provide a shower head 50 on the upper surface of the processing chamber 10 for supplying a processing gas into the processing chamber, as shown in FIGS. 19A to 19C. Specifically, FIG. 19A is an oblique view showing showing the shower head 50. On the other hand, FIGS. 19B and 19C are a plan view showing the bottom state and a cross sectional view of the shower head shown in FIG. 19a, respectively. The shower head 50 is formed of an insulating material such as a fused silica, quartz and a ceramic material. As shown in the drawings, the shower head 50 comprises a processing gas inlet port 51, a buffer chamber 52 and a large number of gas spurting holes 53. A gas inlet pipe 20 is connected to the gas inlet port 51. The processing gas introduced through the gas inlet port 51 into the buffer chamber 52 is once stored in the buffer chamber 52. Then, the processing gas is spurted under a uniform pressure and a uniform flow rate through the holes 53 into the processing chamber positioned below the shower head 50. It should be noted that the shower head 50 is effective for supplying the processing gas into the processing chamber 10 uniformly so as to make the plasma density uniform within the chamber 10.

In the present invention, it is possible for the high frequency antenna to be shaped optionally. For example, the high frequency antenna may be plate-like, rod-like or tubular. Also, the diameter (or thickness) of the conductor forming the high frequency antenna need not be constant. For example, it is possible to use a hollow metal pipe. In this case, a cooling medium may be allowed to flow through the hollow pipe for the cooling purpose.

The plasma processing apparatus of the present invention need not be restricted to a plasma etching apparatus and a plasma CVD apparatus. In other words, the technical idea of the present invention can also be applied to, for example, a plasma sputtering apparatus and a plasma ashing apparatus. Further, the object to be processed by the apparatus of the present invention need not be restricted to a semiconductor wafer. For example, it is possible to use the apparatus of the present invention for applying a plasma processing to an LCD substrate. In the case of applying a plasma processing to an object having a square cross sectional shape such as an LCD substrate, used is a square single loop antenna 24 as shown in FIG. 20 or a square spiral antenna 24 as shown in FIG. 21.

Let us describe another plasma processing apparatus using an induction member, said apparatus comprising a plasma generating section and a plasma processing section. In this apparatus, a plasma stream generated in the plasma generating section is introduced into the plasma processing section so as to apply a plasma processing to an object disposed within the plasma processing section. An induction member is arranged within the plasma generating section. When a high frequency current is allowed to flow through the induction member, an alternating electric field is generated via an insulating member within the plasma processing section. Also, a magnetic field forming means is arranged to surround the plasma generating section so as to form a static magnetic field in a direction perpendicular to the alternating electric field noted above. In this case, the alternating electric field and the static magnetic field noted above are controlled so as to form an electron cyclotron resonance region within the plasma processing section. The apparatus outlined above is called a plasma apparatus utilizing an electron cyclotron resonance (ECR).

In recent years, a marked progress is being made in the miniaturization of the pattern formed in an object such as a semiconductor wafer. In accordance with the progress, it is required to perform a plasma processing more accurately in the sub-micron order. When it comes to, for example, an etching treatment, it is important to satisfy various severe conditions simultaneously. Specifically, it is necessary to achieve a vertical etching. The region to be etched should not be damaged or contaminated. An adverse effect should not be given to the device characteristics. Further, it is required to achieve a high etching selectivity.

Under the circumstances, a plasma apparatus utilizing an electron cyclotron resonance (ECR) has come to attract attentions in this technical field. A typical conventional ECR plasma apparatus is disclosed in, for example, Jap. Pat. Appln. KOKOKU Publication No. 3-43774. Compared with the conventional RIE plasma apparatus, the ECR plasma apparatus disclosed in this prior art permits forming a pattern of a high anisotropy and a high selectivity with a low ion energy. Thus, vigorous researches are being made in an attempt to introduce the ECR plasma apparatus into the manufacturing process of sub-micron devices in the future.

The conventional ECR plasma apparatus is constructed to utilize a micro wave of 2.45 GHz introduced from a magnetron oscillating device into a discharge section through an appropriate waveguide and a magnetic field of 875 Gauss generated from an electromagnetic coil arranged in the vicinity of the discharge section. These micro wave and magnetic field are allowed to act in a suitable region within the discharge section so as to achieve the ECR condition and, thus, to form a plasma stream.

In the conventional ECR plasma apparatus, however, a micro wave is utilized for achieving the ECR condition as pointed out above, with the result that a special waveguide is required for transmitting the micro wave. It is also necessary to form within the discharge section such a high magnetic field as 875 Gauss, which corresponds to the micro wave of 2.45 GHz which can be commercially utilized, making it necessary to install a large and heavy magnet. The particular construction pointed out above brings about enlargement and an increased manufacturing cost of the plasma processing apparatus in accordance with increase in the diameter of the semiconductor wafer. Of course, vigorous researches are being made in an attempt to find some coutermeasures. Further, the plasma stream is considerably affected by the diffusing magnetic field of such a large magnetic field as pointed out above.

The apparatus described above, which has been achieved in view of the inconveniences noted above, permits using a lower frequency region so as to make it possible to achieve the ECR condition with a smaller magnetic field. It follows that the apparatus permits miniaturizing and reducing the manufacturing cost of the plasma processing apparatus.

Let us describe the plasma apparatus, which is applied to an ECR plasma etching apparatus, with reference to the accompanying drawings.

As schematically shown in FIG. 22, the plasma apparatus comprises a plasma generating section A and a plasma processing section B. The plasma generating section A includes a cylindrical quartz tube 102 having, for example, a dome-shaped top portion, an antenna 103 acting as an induction member and surrounding the quartz tube 102, and an electromagnetic coil 106 arranged to surround the quartz tube 102 above the antenna 103.

The antenna 103 is connected to a first high frequency power supply 105 via a matching box 104. A high frequency power can be supplied to the antenna 103 in accordance with a command given from a controller 107. The electromagnetic coil 106 is connected to a power supply 107 and can be excited in accordance with a command given from a controller 108 so as to form a desired static magnetic field.

A first gas inlet passageway 110 is formed in the dome-shaped top portion of the quartz tube 102. A first processing gas, e.g., an inert gas such as an argon gas, is introduced from a first gas source 109 into the plasma generating section A through the first gas inlet passageway 110.

Figure 23:
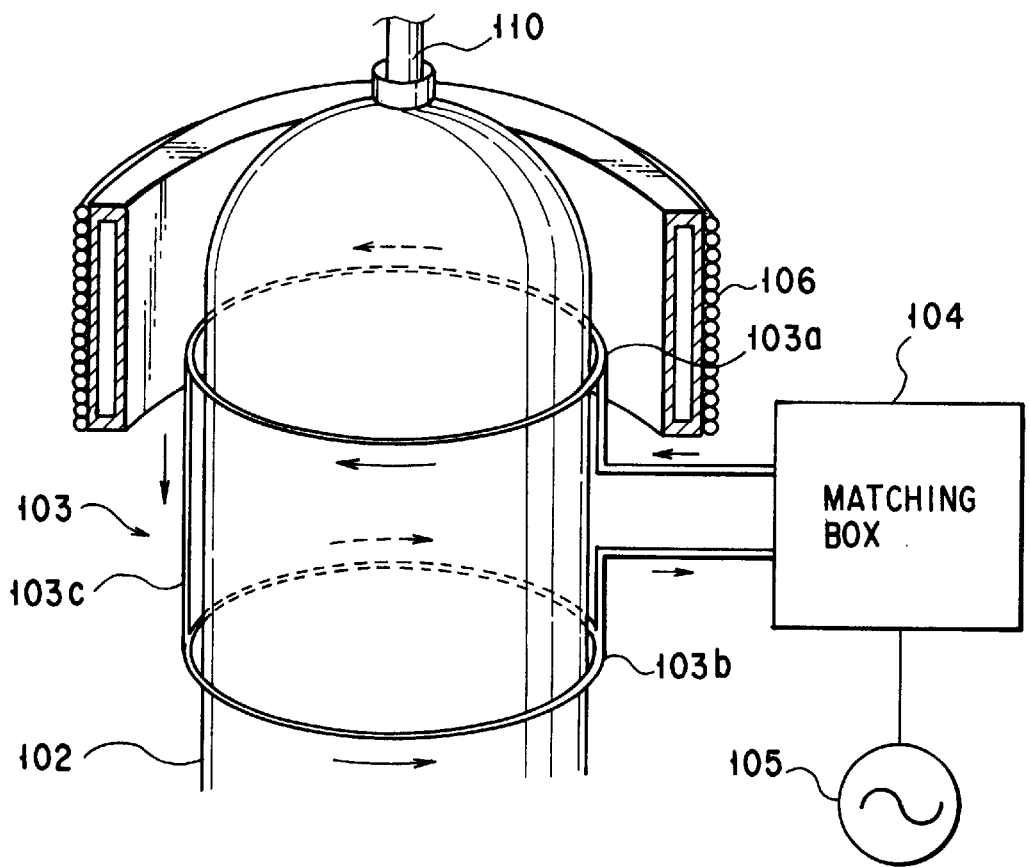
FIG. 23 is an oblique view showing the plasma generating section included in the apparatus shown in FIG. 22.

As shown in FIG. 23 in detail, the antenna 103 consists of an upper ring member 103a, a lower ring member 103b, and a connecting member 103c serving to join these upper and lower ring members 103a and 103b. A desired high frequency current is allowed to flow from the first high frequency power supply 105 into the antenna 103 via the matching box 104 as denoted by arrows in FIG. 23. As a result, an alternating electric field is formed within the cylindrical quartz tube 102. Incidentally, the shape of the antenna is not particularly restricted as far as an alternating electric field can be formed within a desired region.

Figure 24:
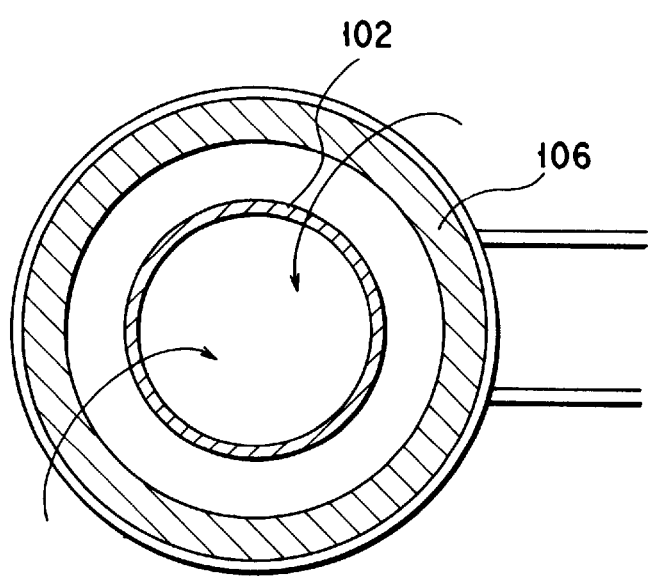
FIG. 24 is a horizontal cross sectional view showing the plasma generating section included in the apparatus shown in FIG. 22.

As apparent from FIGS. 23 and 24, the electromagnetic coil 106 is arranged to surround the cylindrical quartz tube 102 above the antenna 103. Incidentally, about a half portion of the electromagnetic coil 106 is cut away in FIG. 23 in order to facilitate the description of the construction of the apparatus. As denoted by arrows in FIG. 24, which is a plan view, the electromagnetic coil 106 is excited by the power supply 107 so as to form a static magnetic field in a direction perpendicular to the alternating electric field. In the drawing, the static magnetic field thus formed extends downward in a vertical direction, i.e., in the axial direction of the cylindrical tube.

As described herein later, the sizes and outputs of the quartz tube 102, the antenna 103 and the electromagnetic coil 106, which collectively form the plasma generating section, are determined to permit formation of an ECR region E about 20 to 30 cm above the reacting surface of the wafer W. To be more specific, in the apparatus shown in FIG. 22, the ECR region E is allowed to be formed in the vicinity of the junction between the quartz tube 102 and the plasma processing chamber 111.

Let us describe the construction of the plasma processing section B of the plasma processing apparatus utilizing ECR with reference to FIG. 22 again. As shown in the drawing, the plasma processing section B comprises a processing chamber 111 in which an object to be processed such as a semiconductor wafer W is to be processed with a plasma stream generated from the plasma generating section A. A susceptor 112 on which the wafer W is to be supported is arranged within the processing chamber 111. The susceptor 112 is connected to a second high frequency power supply 114 via a matching box 113. An RF bias is applied to the susceptor 112 in accordance with a command generated from the controller 108 in applying an etching treatment to the semiconductor wafer W.

A second gas supply passageway 119 is formed in a shoulder portion of the processing chamber 111. A second processing gas is supplied from a second gas source 118 into the processing chamber 111 through the second gas supply passageway 119. A gas exhaust passageway 116 is formed in a lower portion, which is positioned opposite to the second gas supply passageway 119, of the processing chamber 111. The gas exhaust passageway 116 is connected to a gas exhaust system 115 including a vacuum pump, etc. The free space within the processing chamber 111 is evacuated into a desired degree of vacuum, as desired, by utilizing the gas exhaust system 115 and the gas exhaust passageway 116.

A magnetic field forming means 117 is arranged to surround the side wall of the processing chamber 111. The construction of the magnetic field forming means 117 is substantially equal to that of the magnetic field forming means 42 shown in FIG. 11. To reiterate, the plasma stream introduced from the plasma generating section A can be retained in a desired shape in the vicinity of the processing surface of the semiconductor wafer W, i.e., an object to be processed, by the magnetic field forming means 117.

Where the ECR plasma etching apparatus of the construction described above is used for applying an etching treatment to the semiconductor wafer W, the wafer W is transferred from a load lock chamber (not shown) located adjacent to the processing chamber 111 into the processing chamber 111 whose inner pressure is reduced in advance into, for example, $10^{-6}$ Torr. The wafer W thus transferred into the processing chamber 111 is held by a fixing means such as an electrostatic chuck (not shown) on the susceptor 112 arranged within the processing chamber 111.

In the next step, predetermined processing gases for applying a plasma etching treatment to the semiconductor wafer W are introduced into the quartz tube 102 and the processing chamber 111 through the first gas inlet passageway 110 formed in the dome-shaped top potion of the quartz tube 102 and the second gas inlet passageway 119 formed in the shoulder portion of the processing chamber 111, respectively. In this step, the pressure within the processing chamber 111 is controlled to be, for example, $10^{-3}$ Torr. For example, an inert gas such as an argon gas is introduced through the first gas supply passageway 110. On the other hand, a processing gas such as a $C_2$ gas or a $CHF_3$ gas is supplied through the second gas inlet passageway 119. What should be noted is that the apparatus is constructed to permit supplying processing gases into the plasma generating section A and the plasma processing section B through the two different gas inlet passageways. It follows that the optimum mixing ratio of the processing gases adapted for the etching treatment can be achieved by separately setting the parameters for the plasma generating section A and the plasma processing section B, making it possible to achieve a plasma etching treatment with an excellent control capability.

In generating a plasma, a suitable high frequency current is supplied from the first high frequency power supply 105 to the antenna 103. As a result, an alternating electric field is formed within the processing chamber. At the same time, the electromagnetic coil 106 is excited by the power supply 107 so as to form a static magnetic field having lines of magnetic force running downward in the vertical direction, i.e., running in the axial direction of the quartz tube. If the ECR condition, which is described later, is satisfied, the electrons present within the ECR region are enabled to make spiral movements in a manner to wind the lines of magnetic force of the magnetic field so as to arrive at the plasma potential. As a result, the moving electrons are accelerated in the direction of a weak magnetic field, i.e., accelerated downward in the vertical direction. It follows that formed is a plasma stream flowing in a direction perpendicular to the processing surface of the wafer W.

The condition for achieving the electron cyclotron resonance (ECR) can be obtained when the formula given below is satisfied:

$$B = 2\pi m e f c / e$$

where "B" is the magnetic flux density, "me" is the mass of electron, "fc" is the frequency, and "e" is the electric charge.

The micro wave which can be commercially utilized has such a high frequency as 2.45 GHz. Thus, in the conventional micro wave ECR plasma apparatus, it is necessary to generate such a high magnetic field as 875 Gauss in order to meet the ECR condition. Naturally, it is necessary to use a large and heavy magnet for obtaining the high magnetic field, making it unavoidable for the apparatus to be rendered bulky. Further, it is necessary to use a special waveguide for transmitting the micro wave.

As apparent from the formula given above, the ECR condition can be achieved with a lower magnetic field in the case of using a lower frequency. In the plasma apparatus described above, a high frequency current having a low frequency, e.g., 100 MHz or less, is supplied to the antenna so as to form an alternating electric field. It follows that the ECR condition can be satisfied by forming such a low magnetic field as about 35 Gauss. Naturally, in the apparatus of the present invention, it suffices to use an electromagnetic coil much smaller than in the conventional apparatus, making it possible to simplify and diminish the apparatus.

As shown in FIG. 24, the lines of magnetic force generated from the first magnetic field forming means form a diverging magnetic field. In other words, the lines of magnetic force are deflected toward the periphery of the processing chamber, as these lines extend downward in the vertical direction. As a result, the plasma stream flowing toward the semiconductor wafer W also tends to be diverged. When it comes to, particularly, the conventional micro wave ECR plasma apparatus, it is unavoidable to use such a high magnetic field as 875 Gauss as described previously. Naturally, the diverging magnetic field formed within the processing chamber is also rendered very high. Further, the diverging tendency of the plasma stream is also increased. Under the circumstances, it is very difficult to permit the plasma stream to be incident in a direction perpendicular to the processing surface of the semiconductor wafer W.

In the plasma processing apparatus described above, however, it is possible to use such a small magnetic field as, for example, 35 Gauss, making it possible to diminish the diverging magnetic field generated within the processing chamber 11. It follows that the diverging tendency of the plasma stream introduced into the processing chamber 11 can be suppressed to the minimum level. In particular, the effect of the diverging magnetic field can be made substantially negligible in a region about 20 to 30 cm apart from the ECR region. As a result, the plasma stream can be guided in a direction substantially perpendicular to the processing surface of the semiconductor the semiconductor wafer W, making it possible to achieve a satisfactory anisotropic etching having a high etching selectivity.

It should also be noted that, in the plasma apparatus shown in FIG. 22, a multi-polar magnetic field is generated around the processing chamber 111. As a result, the plasma stream introduced from the plasma generating section A into the processing chamber 111 can be retained in a shape so as to correspond to the processing surface of the semiconductor wafer W. Further, the multi-polar magnetic field permits decreasing the diverging tendency of the plasma stream noted above so as to allow the plasma stream to be incident in a direction perpendicular to the processing surface of the semiconductor wafer W. It follows that it is possible to ensure a high etching selectivity and a high etching uniformity.

Further, in the apparatus shown in FIG. 22, an RF bias is applied from the second high frequency power supply 114 to the susceptor 112 via the matching box 113. Thus, the RF bias can be applied appropriately in accordance with the kind and the pressure of the processing gas used so as to accelerate the ions contained in the plasma stream and, at the same time, to make the ion stream uniform.

When the processing, e.g., the etching processing, is finished as described above, the residual processing gas and the reaction product within the processing chamber 111 are sufficiently withdrawn to the outside by operating the exhaust system 115, followed by taking the semiconductor wafer W supported on the susceptor into the load lock chamber by using a transfer arm.

Figure 25:
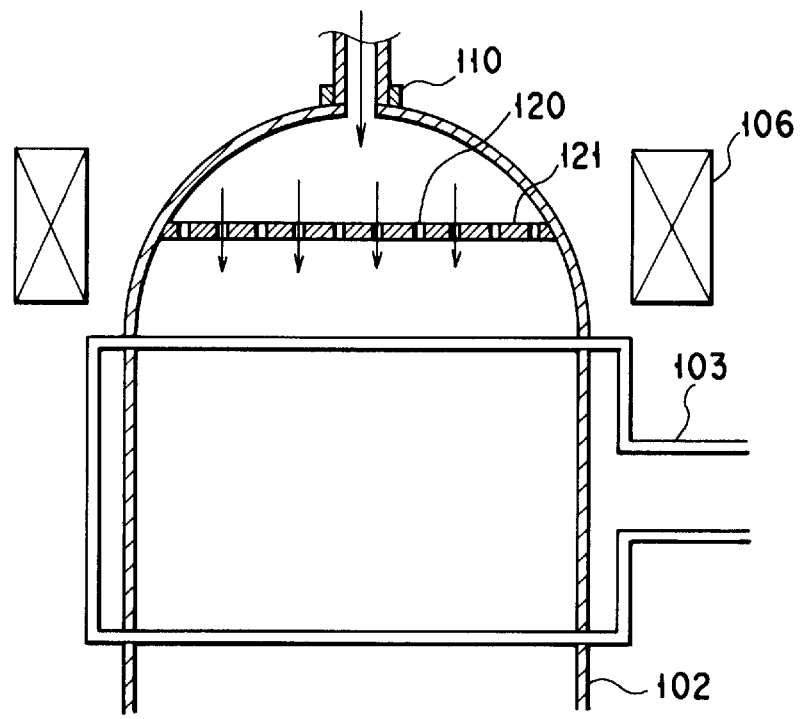
FIGS. 25 and 26 are cross sectional views each exemplifying a gas supply mechanism from a first gas supply tube into the processing chamber, said mechanism being included in the apparatus shown in FIG. 22.
Figure 26:
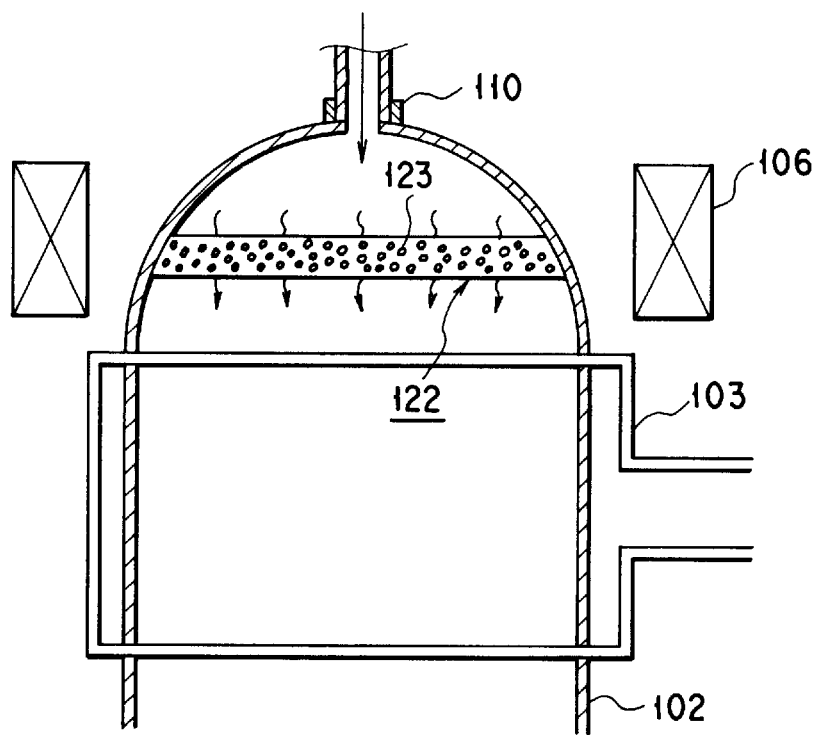

Each of FIGS. 25 and 26 shows another embodiment in respect of the processing gas passageway from the first gas supply passageway 110 formed in the dome-shaped top portion of the quartz tube 102. To be more specific, in the embodiment shown in FIG. 22, the processing gas is introduced from the first gas supply passageway formed in the dome-shaped top portion of the quartz tube 102 directly into the quartz tube 102. However, it is desirable to employ the construction shown in FIG. 25 or 26 in order to allow the processing gas to be dispersed uniformly and promptly into the processing chamber. In the embodiment shown in FIG. 25, the processing gas is introduced through a plate member 121 having a plurality of through holes 120 formed therein so as to permit the gas to be dispersed uniformly and rapidly. On the other hand, in the embodiment shown in FIG. 26, a sponge-like porous member 122 is disposed in the vicinity of the first gas supply passageway 110. In this embodiment, the processing gas is introduced into the plasma generating section through micro pores 123 present in the sponge-like porous member 122 so as to permit the gas to be dispersed uniformly and rapidly.

Figure 27:
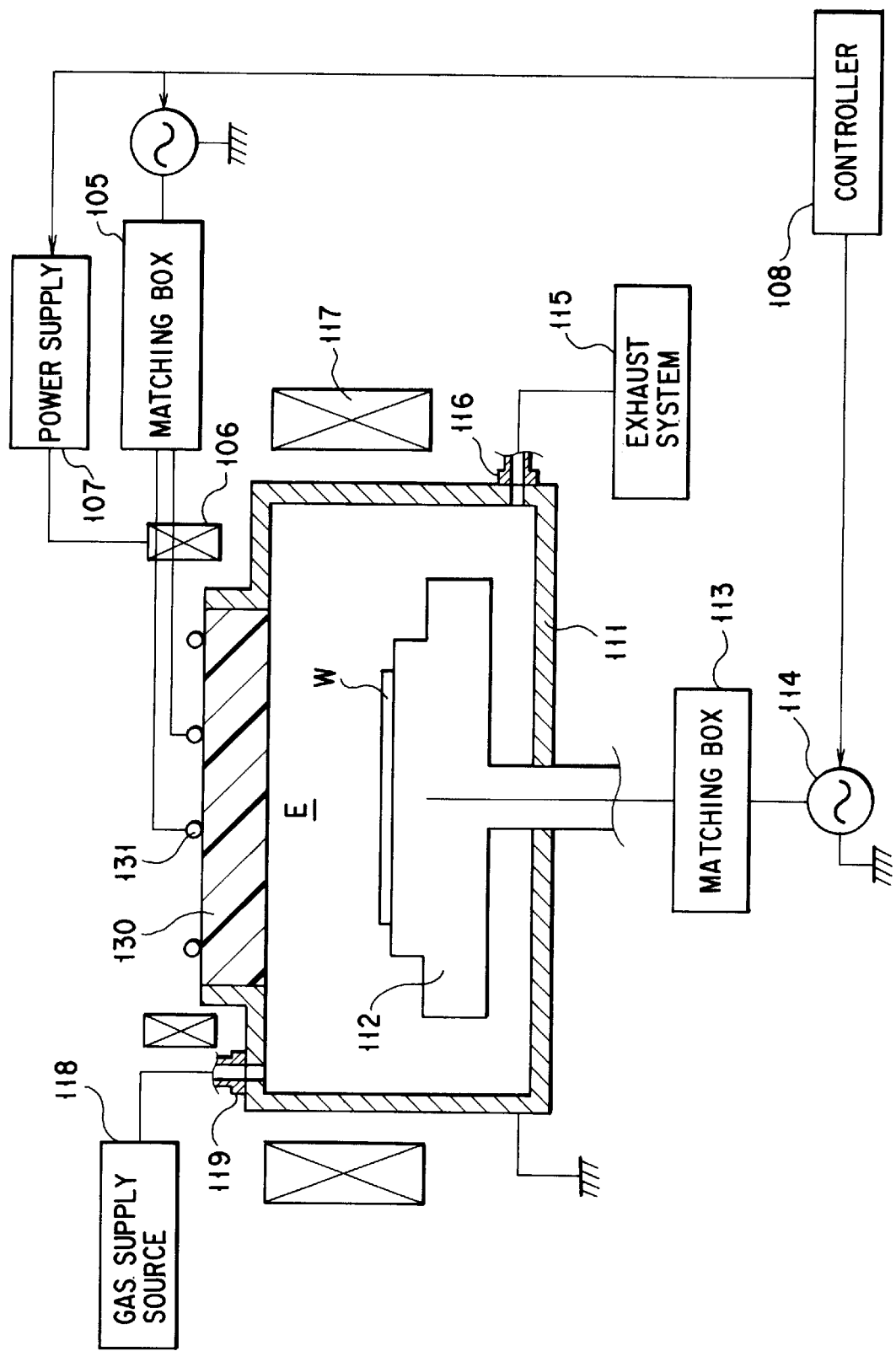
FIG. 27 is a cross sectional view showing a modification of the apparatus shown in FIG. 22.

FIGS. 27 and 28 collectively show an ECR plasma etching apparatus according to still another embodiment of the present invention. Some members of the apparatus shown in FIG. 27 are equal to those shown in FIG. 22 in the function and construction. The same reference numerals are put to these particular members in FIG. 27 and the description thereof is omitted in the following description.

In the apparatus shown in FIG. 27, a quartz plate 130 is arranged on the upper surface of the processing chamber 111 in place of the quartz tube 102 used in the apparatus shown in FIG. 22, and an antenna 131 is arranged on the outer surface of the quartz plate 130. As shown in FIG. 28, the antenna 131 is spiral. A high frequency current is applied from a high frequency power supply 105 to the spiral antenna 131 so as to permit the antenna 131 to form efficiently an alternating electric field. Incidentally, the shape of the antenna arranged on the outer surface of the quartz plate 130 need not be restricted to the spiral shape as shown in FIG. 28. In other words, an antenna of any optional shape can be used as far as a desired alternating electric field can be formed in a desired region.

In the apparatus shown in FIG. 27, an electromagnetic coil 106 is arranged to correspond to the spiral antenna 131, as in the embodiment shown in FIG. 22, making it possible to form a static magnetic field having lines of magnetic force gradually diverging vertically downward. It follows that the apparatus of the embodiment shown in FIG. 27 also permits forming an ECR region in a desired region, e.g., a region 20 to 30 cm above the processing surface of the object to be treated, if the outputs of the antenna 131 and the electromagnetic coil 106 are controlled appropriately.

What should also be noted is that, in the apparatus shown in FIG. 27, it is unnecessary to use such a large member as the quartz tube 102 which is used in the embodiment shown in FIG. 22. It follows that the plasma processing apparatus can be markedly miniaturized.

What is claimed is:

1. A plasma processing apparatus, comprising:

a processing chamber in which an object to be processed is arranged;

a processing gas introducing means for introducing a processing gas into said processing chamber;

a planar induction member arranged on the outer surface of said processing chamber in a plane parallel to a plane of said object to be processed, an insulator being interposed between said induction member and said processing chamber, and a high frequency power being supplied to said induction member so as to form an induction electric field near the object to be processed; and a paramagnetic member arranged to overlap at least partially with said induction member, and positioned to correspond to a central portion of said planar induction member.

2. The plasma processing apparatus according to claim 1, wherein said induction member is spiral.

3. The plasma processing apparatus according to claim 1, wherein said induction member is in the form of a single loop.

4. The plasma processing apparatus according to claim 1, wherein said induction member comprises two members each being in the form of a single loop and said two single loops are arranged in a concentric configuration.

5. The plasma processing apparatus according to claim 4, wherein said two members each being in the form of a single loop are independently controlled in respect of the high frequency power supplied thereto.

6. The plasma processing apparatus according to claim 1, wherein said paramagnetic member is in the form of a plate.

7. The plasma processing apparatus according to claim 1, wherein said paramagnetic member is formed of copper.

8. The plasma processing apparatus according to claim 1, wherein said induction member is spiral and has a space region in the central portion.

9. The plasma processing apparatus according to claim 1, wherein said processing gas introducing means is formed in the upper wall of said processing chamber and comprises a gas introducing body formed of an insulator, a gas inlet port, and a large number of gas spurting ports.

10. The plasma processing apparatus according to claim 1, which further comprises a high frequency power applying means for applying a high frequency bias to an object to be processed.

11. The plasma processing apparatus according to claim 1, wherein said planar induction member and said paramagnetic member have circular outer configurations, and the planar induction member has a diameter larger than that of the paramagnetic member.

12. The plasma processing apparatus according to claim 1, wherein said planar induction member directly contacts the paramagnetic member.

13. The plasma processing apparatus according to claim 1, wherein said paramagnetic member includes a nonbiased conductive plate.

* * * * *